US010763336B2

(12) United States Patent
Yanagigawa

(10) Patent No.: US 10,763,336 B2
(45) Date of Patent: Sep. 1, 2020

(54) SEMICONDUCTOR DEVICE AND METHOD FOR MANUFACTURING THE SAME

(71) Applicant: RENESAS ELECTRONICS CORPORATION, Tokyo (JP)

(72) Inventor: Hiroshi Yanagigawa, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/121,346

(22) Filed: Sep. 4, 2018

(65) Prior Publication Data

US 2019/0097008 A1 Mar. 28, 2019

(30) Foreign Application Priority Data

Sep. 28, 2017 (JP) .................... 2017-188349

(51) Int. Cl.
| | | |
|---|---|---|
| H01L 29/423 | (2006.01) | |
| H01L 27/088 | (2006.01) | |
| H01L 29/06 | (2006.01) | |
| H01L 29/417 | (2006.01) | |
| H01L 21/8234 | (2006.01) | |
| H01L 29/78 | (2006.01) | |
| H01L 29/08 | (2006.01) | |
| H01L 21/265 | (2006.01) | |
| H02H 7/18 | (2006.01) | |

(Continued)

(52) U.S. Cl.
CPC .. *H01L 29/4236* (2013.01); *H01L 21/823481* (2013.01); *H01L 21/823487* (2013.01); *H01L 27/088* (2013.01); *H01L 29/0684* (2013.01); *H01L 29/0847* (2013.01); *H01L 29/41741* (2013.01); *H01L 29/7827* (2013.01); *H01L 21/02164* (2013.01); *H01L 21/02236* (2013.01); *H01L 21/26513* (2013.01); *H01L 21/3081* (2013.01); *H01L 21/823437* (2013.01); *H01L 21/823475* (2013.01); *H01L 29/42368* (2013.01); *H01L 29/42376* (2013.01); *H01L 29/4916* (2013.01); *H02H 7/18* (2013.01)

(58) Field of Classification Search
CPC ............ H01L 29/4236; H01L 29/7802; H01L 29/7811; H01L 27/08
See application file for complete search history.

(56) References Cited

U.S. PATENT DOCUMENTS

| 7,902,596 B2 | 3/2011 | Kitamura et al. |
| 10,541,327 B2 * | 1/2020 | Weyers ............ H01L 29/66734 |
| 2006/0118866 A1 | 6/2006 | Yanagida et al. |

FOREIGN PATENT DOCUMENTS

| JP | 2004-274039 A | 9/2004 |
| JP | 2006-147700 A | 6/2006 |
| JP | 2007-201338 A | 8/2007 |

* cited by examiner

*Primary Examiner* — Mark V Prenty
(74) *Attorney, Agent, or Firm* — McDermott Will & Emery LLP

(57) ABSTRACT

A semiconductor device which simplifies the manufacturing process while decreasing the width of separation between a first MOS transistor area and a second MOS transistor area, and a method for manufacturing the semiconductor device. A first MOS transistor and a second MOS transistor configure a bidirectional switch. The first MOS transistor and second MOS transistor each have a vertical trench structure. A first impurity region abuts on the side wall of a first gate trench of a first MOS transistor element outside the first MOS transistor area and is electrically coupled to a first source region.

8 Claims, 34 Drawing Sheets

(51) Int. Cl.
*H01L 29/49* (2006.01)
*H01L 21/308* (2006.01)
*H01L 21/02* (2006.01)

SEMICONDUCTOR DEVICE AND METHOD FOR MANUFACTURING THE SAME

CROSS-REFERENCE TO RELATED APPLICATIONS

The disclosure of Japanese Patent Application No. 2017-188349 filed on Sep. 28, 2017 including the specification, drawings and abstract is incorporated herein by reference in its entirety.

BACKGROUND

The present invention relates to a semiconductor device and a method for manufacturing the same and more particularly to a semiconductor device having a bidirectional switch and a method for manufacturing the same.

For example, Japanese Unexamined Patent Application Publications No. 2004-274039, 2007-201338, and 2006-147700 each describe a semiconductor device having a bidirectional switch.

In Japanese Unexamined Patent Application Publications No. 2004-274039, 2007-201338, and 2006-147700, a vertical first MOS (Metal Oxide Semiconductor) transistor element and second MOS transistor element which configure a bidirectional switch are alternately arranged in one chip.

SUMMARY

As for the structure in which a first MOS transistor element area and a second MOS transistor element area are alternately arranged as described in Japanese Unexamined Patent Application Publications No. 2004-274039, 2007-201338, and 2006-147700, the need exists to decrease the width of separation between a first MOS transistor element area and a second MOS transistor element area and simplify the manufacturing process.

The above and further objects and novel features of the invention will more fully appear from the following detailed description in this specification and the accompanying drawings.

According to one aspect of the invention, there is provided a semiconductor device which has a bidirectional switch. The semiconductor device includes a semiconductor substrate, a first transistor element, and a first impurity region of the second conductivity type. The semiconductor substrate has a first surface and a second surface opposite to each other and has a first gate trench extending from the first surface toward the second surface. The first transistor element includes a first drain region of the first conductivity type located in the second surface, a first source region of the first conductivity type located in the first surface, and a first gate electrode located inside the first gate trench and is included in the bidirectional switch. The first impurity region abuts on a side wall of the first gate trench outside an area for the first transistor element and is electrically coupled to the first source region.

According to another aspect of the invention, there is provided a method for manufacturing a semiconductor device having a bidirectional switch, which includes the following steps.

A semiconductor substrate which has a first surface and a second surface opposite to each other and has a first gate trench extending from the first surface toward the second surface is formed. A first transistor element is formed, which includes a first drain region of the first conductivity type located in the second surface, a first source region of the first conductivity type located in the first surface, and a first gate electrode located inside the first gate trench and is included in the bidirectional switch. A first impurity region of the second conductivity type is formed, which abuts on a side wall of the first gate trench outside an area for the first transistor element and is electrically coupled to the first source region.

According to the present invention, there are provided a semiconductor device which simplifies the manufacturing process while decreasing the width of separation between the first MOS transistor element area and the second MOS transistor element area and a method for manufacturing the same.

DETAILED DESCRIPTION

First, the mode of use of the semiconductor device according to each of the embodiments described below will be explained.

Mode of Use of the Semiconductor Device

Figure 1:
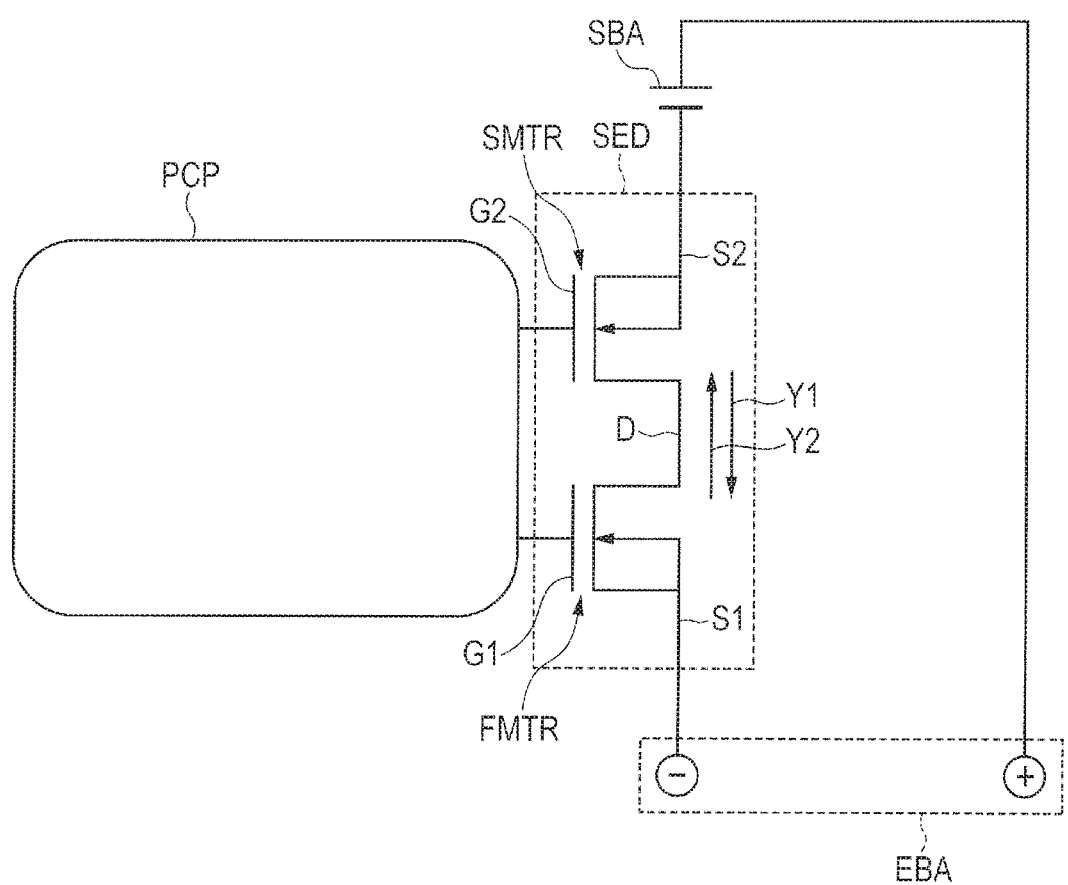
FIG. 1 shows an example of a protection circuit applied to a semiconductor device according to each embodiment.

The circuit shown in FIG. 1 is, for example, a protection circuit for a secondary battery SBA. The secondary battery SBA is, for example, a lithium ion battery. A semiconductor device SED and a controller PCP are coupled to the secondary battery SBA.

The semiconductor device SED has a bidirectional switch. This bidirectional switch includes a first MOS transistor FMTR and a second MOS transistor SMTR. The first MOS transistor FMTR and second MOS transistor SMTR are electrically coupled to each other in series.

Specifically, the drain D of the first MOS transistor FMTR and the drain D of the second MOS transistor are electrically coupled to each other. The source S1 of the first MOS transistor FMTR is electrically coupled to the minus (−) terminal of the protection circuit. The source S2 of the second MOS transistor SMTR is electrically coupled to the minus (−) electrode of the secondary battery SBA.

The plus (+) electrode of the secondary battery SBA is electrically coupled to the plus terminal of the protection circuit. The first gate G1 of the first MOS transistor FMTR and the second gate G2 of the second MOS transistor SMTR are electrically coupled to the controller PCP.

In order to charge the secondary battery SBA in this protection circuit, first an external power source EBA is coupled to the minus terminal and plus terminal of the protection circuit. According to a signal from the controller PCP, the first MOS transistor FMTR and second MOS transistor SMTR in the semiconductor device SED are both turned on. A current flows from the external power source EBA in the direction of arrow Y1 to charge the secondary battery SBA.

When charging is completed, the controller PCP detects completion of charging and turns off the first MOS transistor FMTR. This breaks the circuit and prevents the secondary battery SBA from being overcharged.

In order to discharge the secondary battery SBA, a load (not shown) is coupled to the minus terminal and plus terminal of the protection circuit. According to a signal from the controller PCP, the first MOS transistor FMTR and second MOS transistor SMTR in the semiconductor device SED are both turned on. A current flows from the secondary battery SBA to the load in the direction of arrow Y2 so that the amount of electricity stored in the second battery SBA is decreased and the secondary battery SBA is discharged.

When discharging is completed, the controller PCP detects the completion of discharging and turns off the second MOS transistor SMTR. This breaks the circuit and prevents the secondary battery SBA from being over-discharged.

Next, the semiconductor device SED including a first MOS transistor FMTR and a second MOS transistor SMTR will be described.

First Embodiment

Figure 2:
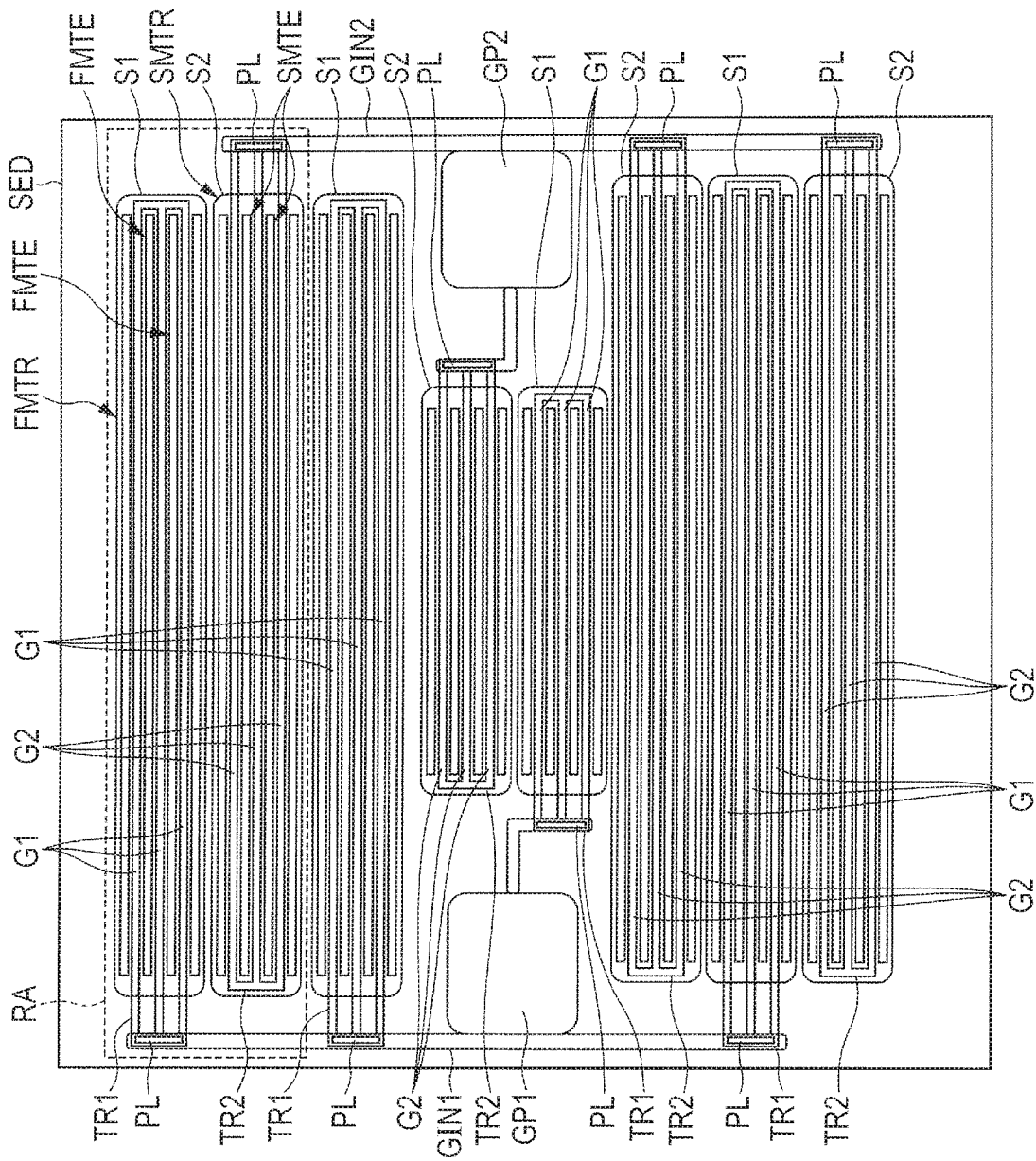
FIG. 2 is a plan view which shows the structure of the semiconductor device according to the first embodiment.
Figure 3:
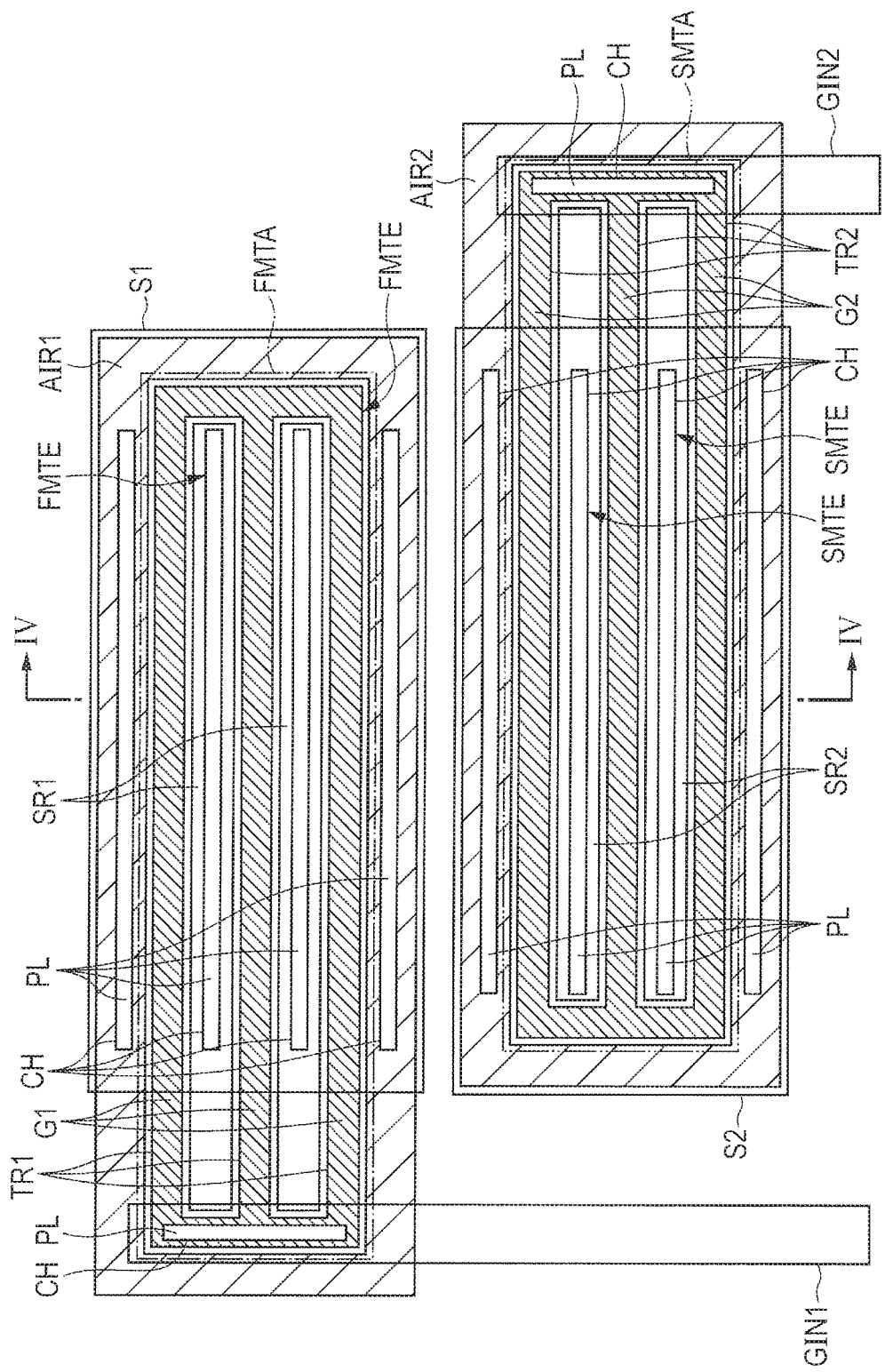
FIG. 3 is a fragmentary enlarged plan view which shows the area RA in FIG. 2.

As shown in FIGS. 2 and 3, the semiconductor device SED according to the first embodiment includes a first MOS transistor FMTR and a second MOS transistor SMTR.

The first MOS transistor FMTR includes a plurality of first MOS transistor elements FMTE. The first MOS transistor elements FMTE are separately arranged in a plurality of first MOS transistor areas FMTA (FIG. 3).

As shown in FIG. 3, the first MOS transistor area FMTA is surrounded by the peripheral wall of a first gate trench TR1 in plan view (area surrounded by the chain line in the figure). A plurality of first MOS transistor elements FMTE are arranged in one first MOS transistor area FMTA. In this embodiment, for example, two first MOS transistor elements FMTE are arranged in one first MOS transistor area FMTA. However, instead the number of first MOS transistor elements FMTE arranged in one first MOS transistor area FMTA may be one or more than two.

As shown in FIGS. 2 and 3, the second MOS transistor SMTR includes a plurality of second MOS transistor elements SMTE. The second MOS transistor elements SMTE are separately arranged in a plurality of second MOS transistor areas SMTA (FIG. 3).

As shown in FIG. 3, the second MOS transistor area SMTA is surrounded by the peripheral wall of a second gate trench TR2 in plan view (area surrounded by the chain double-dashed line in the figure). A plurality of second MOS transistor elements SMTE are arranged in one second MOS transistor area SMTA. In this embodiment, for example, two second MOS transistor elements SMTE are arranged in one second MOS transistor area SMTA. However, instead the number of second MOS transistor elements SMTE arranged in one second MOS transistor area SMTA may be one or more than two.

As shown in FIGS. 2 and 3, the first MOS transistor areas FMTA and second MOS transistor areas SMTA are alternately arranged in plan view. One first source electrode S1 is located in one first MOS transistor area FMTA. The first source electrode S1 is electrically coupled to the first source region of a first MOS transistor element FMTE through a plug conductive layer PL as described later. One first source electrode S1 is electrically coupled to a plurality of first MOS transistor elements FMTE.

One second source electrode S2 is located in one second MOS transistor area SMTA. The second source electrode S2 is electrically coupled to the second source region of a second MOS transistor element SMTE through a plug conductive layer PL as described later. One second source electrode S2 is electrically coupled to a plurality of second MOS transistor elements SMTE.

A first gate electrode G1 is located inside a first gate trench TR1 in one first MOS transistor area FMTA as described later. Each of the first gate electrodes G1 is electrically coupled to a first gate wiring layer GIN1 through a plug conductive layer PL. The first gate wiring layer GIN1 is electrically coupled to a first gate pad GP1.

Consequently, the first gate electrode G1 of each of the first MOS transistor areas FMTA is electrically coupled to the first gate pad GP1 through the plug conductive layer PL and the first gate wiring layer GIN1.

A second gate electrode G2 is located inside a second gate trench TR2 in one second MOS transistor area SMTA as described later. Each of the second gate electrodes G2 is electrically coupled to a second gate wiring layer GIN2 through a plug conductive layer PL. The second gate wiring layer GIN2 is electrically coupled to a second gate pad GP2.

Consequently, the second gate electrode G2 of each of the second MOS transistor areas SMTA is electrically coupled to the second gate pad GP2 through the plug conductive layer PL and the second gate wiring layer GIN2.

Figure 4:
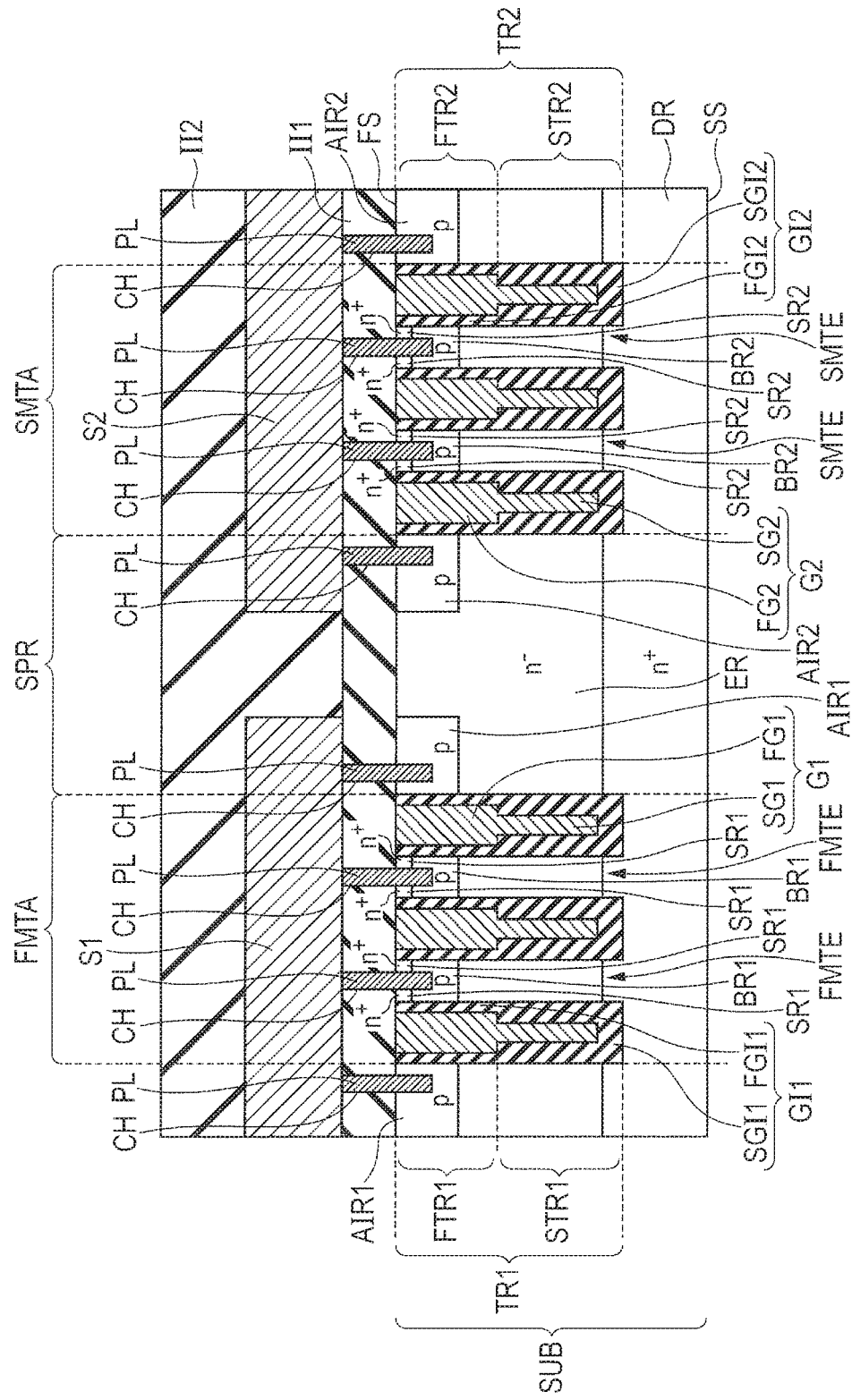
FIG. 4 is a schematic sectional view taken along the line IV-IV in FIG. 3.

As shown in FIG. 4, the semiconductor substrate SUB has a first surface FS and a second surface SS which are opposite to each other. A plurality of first MOS transistor elements FMTE and a plurality of second MOS transistor elements SMTE are formed in the semiconductor substrate SUB.

The first MOS transistor elements FMTE and second MOS transistor elements SMTE each have a vertical trench gate structure.

The semiconductor substrate SUB has a first gate trench TR1 in the first surface FS in the first MOS transistor area FMTA. Also, the semiconductor substrate SUB has a second gate trench TR2 in the first surface FS in the second MOS transistor area SMTA.

A first drain region DR, first epitaxial region ER, first base region BR1, and first source region SR1 are located in the semiconductor substrate SUB in the first MOS transistor area FMTA.

The first drain region DR has n-type conductivity and lies in the second surface SS of the semiconductor substrate SUB. The first epitaxial region ER has n-type conductivity and has a lower n-type impurity concentration than the first drain region DR. The first epitaxial region ER lies on the first surface FS side of the first drain region DR and abuts on the first drain region DR.

The first source region SR1 has n-type conductivity and lies in the first surface FS of the semiconductor substrate SUB. The first base region BR1 has p-type conductivity and lies between the first source region SR1 and the first epitaxial region ER. The first base region BR1 makes a PN junction with the first source region SR1 and a PN junction with the first epitaxial region ER.

The first gate trench TR1 extends from the first surface FS to reach the first drain region DR. This causes on-state current to flow along the side wall and bottom wall of the first gate trench TR1. A first gate electrode G1 is located inside the first gate trench TR1. The first gate electrode G1 is, for example, made of polycrystalline silicon doped with impurities. A first gate insulating layer GI1 lies between the wall face of the first gate trench TR1 and the first gate electrode G1.

The first gate insulating layer GI1 has a first thinner film portion FGI1 and a first thicker film portion SGI1. The thickness of the first gate insulating layer GI1 in the first thinner film portion FGI1 is smaller than the thickness of the first gate insulating layer GI1 in the first thicker film portion SGI1.

The first thinner film portion FGI1 is nearer to the first surface FS than the first thicker film portion SGI1. The first thinner film portion FGI1 extends from the first surface FS to a first depth position. The first thicker film portion SGI1 extends from the first depth position to a second depth position nearer to the second surface SS than the first depth position. The second depth position is the same as the depth position of the bottom of the first gate trench TR1.

The first gate electrode G1 has a first wider portion FG1 and a first narrower portion SG1. The width of the first gate electrode G1 in the first wider portion FG1 is larger than the width of the first gate electrode G1 in the first narrower portion SG1.

The first wider portion FG1 is nearer to the first surface FS than the first narrower portion SG1. The first wider portion FG1 extends from the first surface FS to the first depth position. The first narrower portion SG1 extends from the first depth position to a position nearer to the second surface SS than the first depth position.

The first gate trench TR1 has a first shallower trench portion FTR1 and a first deeper trench portion STR1. The first shallower trench portion FTR1 abuts on the first thinner film portion FGI1 and the first deeper trench portion STR1 abuts on the first thicker film portion SGI1. The first shallower trench portion FTR1 is nearer to the first surface FS than the first deeper trench portion STR1.

A first impurity region AIR1 is located outside the first MOS transistor area FMTA in a manner to abut on the side wall of the first gate trench TR1. The first impurity region AIR1 has p-type conductivity and lies in the first surface FS. The first impurity region AIR1 makes a PN junction with the first epitaxial region ER. The bottom (end on the second surface SS side) of the first impurity region AIR1 is nearer to the first surface FS than to the first depth position. Alternatively the bottom (end on the second surface SS side) of the first impurity region AIR1 may be at the same depth level as the first depth position. The first impurity region AIR1 surrounds the first gate trench TR1 in plan view as shown in FIG. 3.

As shown in FIG. 4, a second drain region DR, second epitaxial region ER, second base region BR2, and second source region SR2 are located in the semiconductor substrate SUB in the second MOS transistor area SMTA.

The second drain region DR has n-type conductivity and lies in the second surface SS of the semiconductor substrate SUB. The second drain region DR is electrically coupled to the first drain region DR. The second drain region DR shares the same impurity region with the first drain region DR.

The second epitaxial region ER has n-type conductivity and has a lower n-type impurity concentration than the second drain region DR. The second epitaxial region ER lies on the first surface FS side of the second drain region DR and abuts on the second drain region DR.

The second epitaxial region ER is electrically coupled to the first epitaxial region ER. The second epitaxial region ER shares the same impurity region with the first epitaxial region ER.

The second source region SR2 has n-type conductivity and lies in the first surface FS of the semiconductor substrate SUB. The second base region BR2 has p-type conductivity and lies between the second source region SR2 and the second epitaxial region ER. The second base region BR2 makes a PN junction with the second source region SR2 and a PN junction with the second epitaxial region ER.

The second gate trench TR2 extends from the first surface FS to reach the second drain region DR. This causes on-state current to flow along the side wall and bottom wall of the second gate trench TR2. A second gate electrode G2 is located in the second gate trench TR2. The second gate electrode G2 is, for example, made of polycrystalline silicon doped with impurities. A second gate insulating layer GI2 lies between the wall face of the second gate trench TR2 and the second gate electrode G2.

The second gate insulating layer GI2 has a second thinner film portion FGI2 and a second thicker film portion SGI2. The thickness of the second gate insulating layer GI2 in the second thinner film portion FGI2 is smaller than the thickness of the second gate insulating layer GI2 in the second thicker film portion SGI2.

The second thinner film portion FGI2 is nearer to the first surface FS than the second thicker film portion SGI2. The second thinner film portion FGI2 extends from the first surface FS to a first depth position. The second thicker film portion SGI2 extends from the first depth position to a second depth position nearer to the second surface SS than the first depth position. The second depth position is the same as the depth position of the bottom of the second gate trench TR2.

The second gate electrode G2 has a second wider portion FG2 and a second narrower portion SG2. The width of the second gate electrode G2 in the second wider portion FG2 is larger than the width of the second gate electrode G2 in the second narrower portion SG2.

The second wider portion FG2 is nearer to the first surface FS than the second narrower portion SG2. The second wider portion FG2 extends from the first surface FS to the first depth position. The second narrower portion SG2 extends from the first depth position to a position nearer to the second surface SS than the first depth position.

The second gate trench TR2 has a second shallower trench portion FTR2 and a second deeper trench portion STR2. The second shallower trench portion FTR2 abuts on the second thinner film portion FGI2 and the second deeper trench portion STR2 abuts on the second thicker film portion SGI2. The second shallower trench portion FTR2 is nearer to the first surface FS than the second deeper trench portion STR2.

The first depth position to which the first thinner film portion FGI1 extends is almost the same as the first depth position to which the second thinner film portion FGI2 extends. The second depth position to which the first thicker film portion SGI1 extends is almost the same as the second depth position to which the second thicker film portion SGI2 extends. The depth position of the end of the first narrower portion SG1 on the second surface SS side is almost the same as the depth position of the end of the second narrower portion SG2 on the second surface SS side.

A second impurity region AIR2 is located outside the second MOS transistor area SMTA in a manner to abut on the side wall of the second gate trench TR2. The second impurity region AIR2 has p-type conductivity and lies in the first surface FS. The second impurity region AIR2 makes a PN junction with the second epitaxial region ER. The bottom (end on the second surface SS side) of the second impurity region AIR2 is nearer to the first surface FS than to the first depth position. Alternatively the bottom (end on the second surface SS side) of the second impurity region AIR2 may be at the same depth level as the first depth position. The second impurity region AIR2 surrounds the second gate trench TR2 in plan view as shown in FIG. 3.

The first impurity region AIR1 and the second impurity region AIR2 are separated from each other. Specifically, in a separation area SPR between the first MOS transistor area FMTA and the second MOS transistor area SMTA, the first impurity region AIR1 and the second impurity region AIR2 are separated from each other with the epitaxial region ER (first or second epitaxial region ER) between them.

An interlayer insulating layer ill lies over the first surface FS of the semiconductor substrate SUB. A plurality of contact holes CH are made in the interlayer insulating layer ill so as to reach the first surface FS of the semiconductor substrate SUB from the upper surface of the interlayer insulating layer II1. The contact holes CH have the same depth and extend from the first surface FS of the semiconductor substrate SUB toward the second surface SS. A plug conductive layer PL, for example, of tungsten (W) is buried in each of the contact holes CH.

Each contact hole CH in the first MOS transistor area FMTA passes from the first surface FS of the semiconductor substrate SUB through the first source region SR1 and reaches the first base region BR1. Therefore, the plug conductive layer PL buried in each contact hole CH in the first MOS transistor area FMTA abuts on the first source region SR1 and the first base region BR1.

A plug conductive layer PL is also buried in each contact hole CH which extends from the upper surface of the interlayer insulating layer II1 and reaches the first impurity region AIR1.

A first source electrode S1 is located over the upper surface of the interlayer insulating layer II1 in a manner to lie just over the first MOS transistor area FMTA. The first source electrode S1 is coupled to the plug conductive layer PL buried in each contact hole CH in the first MOS transistor area FMTA and the plug conductive layer PL buried in each contact hole CH reaching the first impurity region AIR1. Consequently, the first source electrode S1 is electrically coupled to the first source region SR1, first base region BR1, and first impurity region AIR1 through the plug conductive layers PL. The first impurity region AIR1 is made to have the same potential (first source potential) as the first source electrode S1.

The first source electrode S1 is located just over the a plurality of first MOS transistor elements FMTE and electrically coupled to the first MOS transistor elements FMTE.

Each contact hole CH in the second MOS transistor area SMTA passes from the first surface FS of the semiconductor substrate SUB through the second source region SR2 and reaches the second base region BR2. Therefore, the plug conductive layer PL buried in each contact hole CH in the second MOS transistor area SMTA abuts on the second source region SR2 and the second base region BR2.

A plug conductive layer PL is also buried in each contact hole CH which extends from the upper surface of the interlayer insulating layer II1 and reaches the second impurity region AIR2.

A second source electrode S2 is located over the upper surface of the interlayer insulating layer II1 in a manner to lie just over the second MOS transistor area SMTA. The second source electrode S2 is coupled to the plug conductive layer PL buried in each contact hole CH in the second MOS transistor area SMTA and the plug conductive layer PL buried in each contact hole CH reaching the second impurity region AIR2. Consequently, the second source electrode S2 is electrically coupled to the second source region SR2, second base region BR2, and second impurity region AIR2 through the plug conductive layers PL. The second impurity region AIR2 is made to have the same potential (second source potential) as the second source electrode S2.

The second source electrode S2 is located just over the plurality of second MOS transistor elements SMTE and electrically coupled to the second MOS transistor elements SMTE.

An interlayer insulating layer 112 is formed over the interlayer insulating layer II1 so as to cover the first source electrode S1 and second source electrode S2. A back electrode (drain electrode) is not formed in the second surface SS of the semiconductor substrate SUB.

Figure 5:
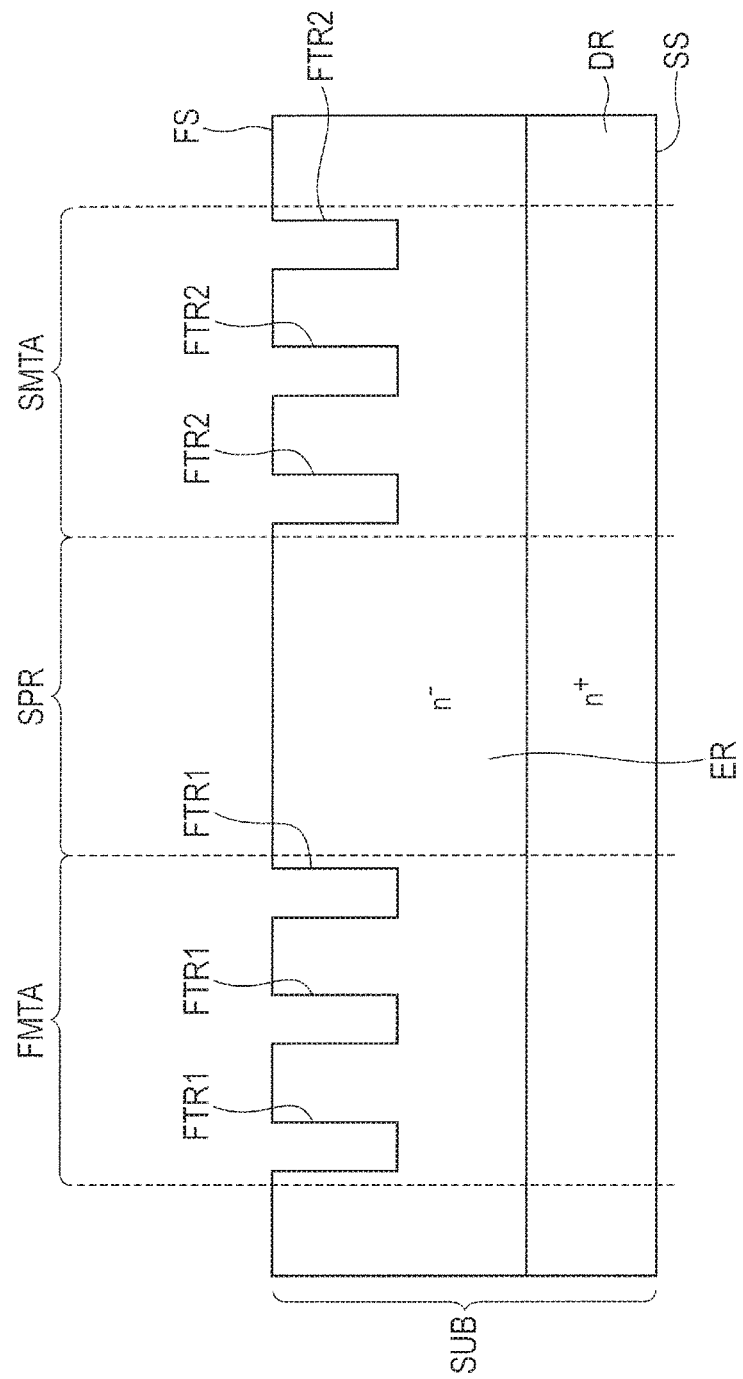
FIG. 5 is a sectional view which shows the first step of the method for manufacturing the semiconductor device according to the first embodiment.

Next, the method for manufacturing the semiconductor device according to the first embodiment will be described referring to FIGS. 4 to 14. As shown in FIG. 5, an n⁻ epitaxial region ER is formed over a drain region DR by epitaxial growth. Consequently, a semiconductor substrate SUB is formed in which the drain region DR is located in the second surface SS and the n⁻ epitaxial region ER is located in the first surface FS. The drain region DR is a region to become the first drain region and the second drain region. The epitaxial region ER is a region to become the first epitaxial region and the second epitaxial region.

After that, by the ordinary photoengraving technique and the etching technique, a first shallower trench portion FTR1 is made in the first surface FS in the first MOS transistor area FMTA and a second shallower trench portion FTR2 is made in the first surface FS in the second MOS transistor area SMTA.

Figure 6:
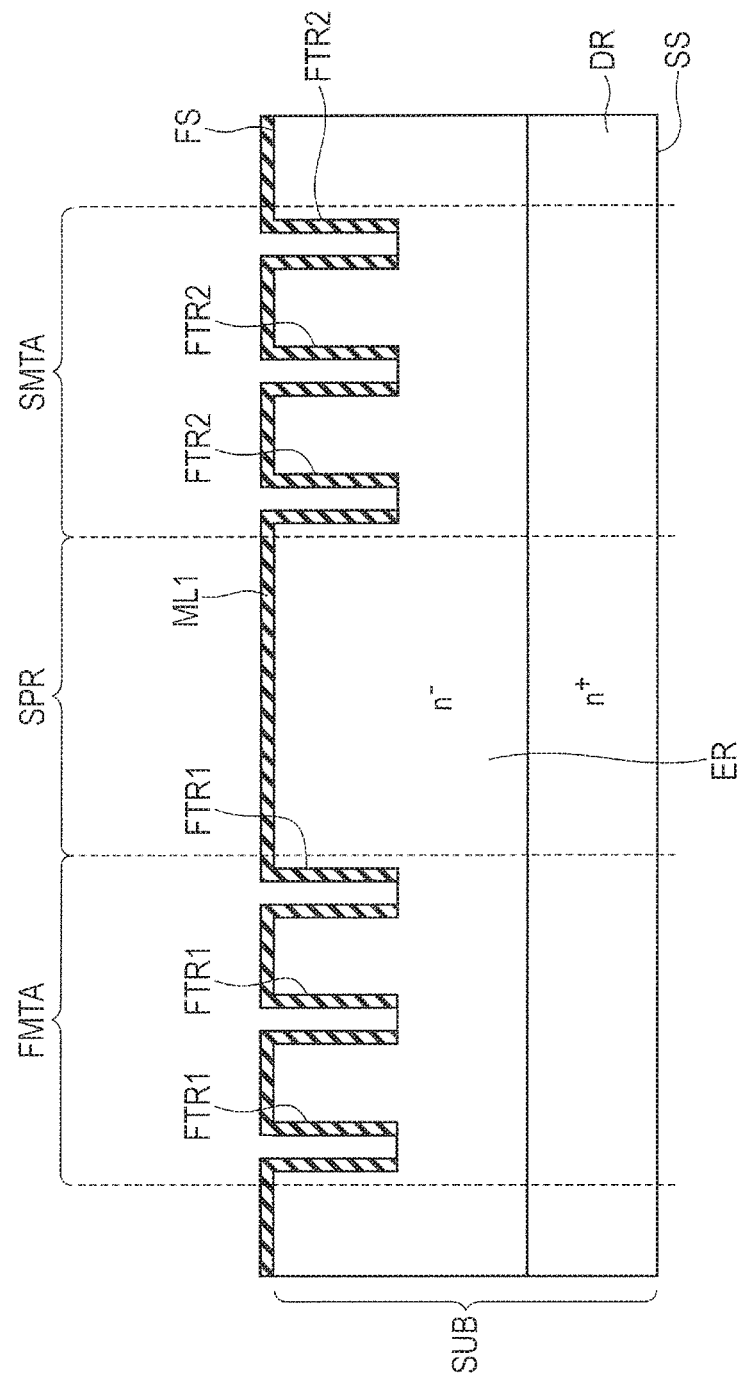
FIG. 6 is a sectional view which shows the second step of the method for manufacturing the semiconductor device according to the first embodiment.

As shown in FIG. 6, a mask layer ML1 is formed in a manner to cover the first surface FS of the semiconductor substrate SUB and the wall faces of the first shallower trench portion FTR1 and second shallower trench portion FTR2. The mask layer ML1 is, for example, a silicon nitride film. Then, the mask layer ML1 is selectively removed. Consequently, the bottom of the first shallower trench portion FTR1 and the bottom of the second shallower trench portion FTR2 are partially exposed from the mask layer ML1.

After that, the portion of the bottom of the first shallower trench portion FTR1 and the portion of the bottom of the second shallower trench portion FTR2 which are exposed from the mask layer ML1 are removed by etching.

Figure 7:
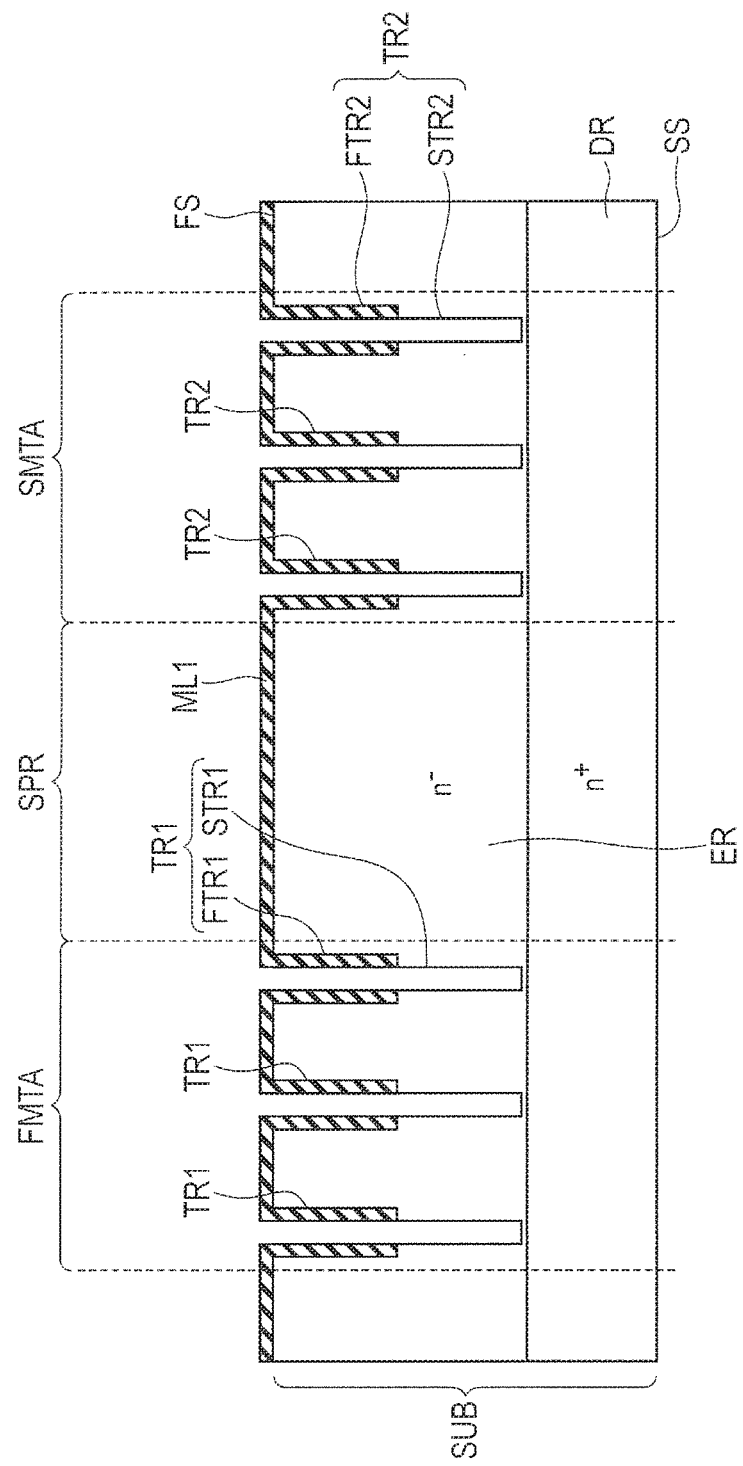
FIG. 7 is a sectional view which shows the third step of the method for manufacturing the semiconductor device according to the first embodiment.

As shown in FIG. 7, as a result of etching as mentioned above, a first deeper trench portion STR1 is made under the first shallower trench portion FTR1. Similarly, a second deeper trench portion STR2 is made under the second shallower trench portion FTR2. The first deeper trench portion STR1 is formed so as to have a smaller width than the first shallower trench portion FTR1. The second deeper trench portion STR2 is formed so as to have a smaller width than the second shallower trench portion FTR2. The first shallower trench portion FTR1 and first deeper trench portion STR1 configure a first gate trench TR1 and the second shallower trench portion FTR2 and second deeper trench portion STR2 configure a second gate trench TR2.

Figure 8:
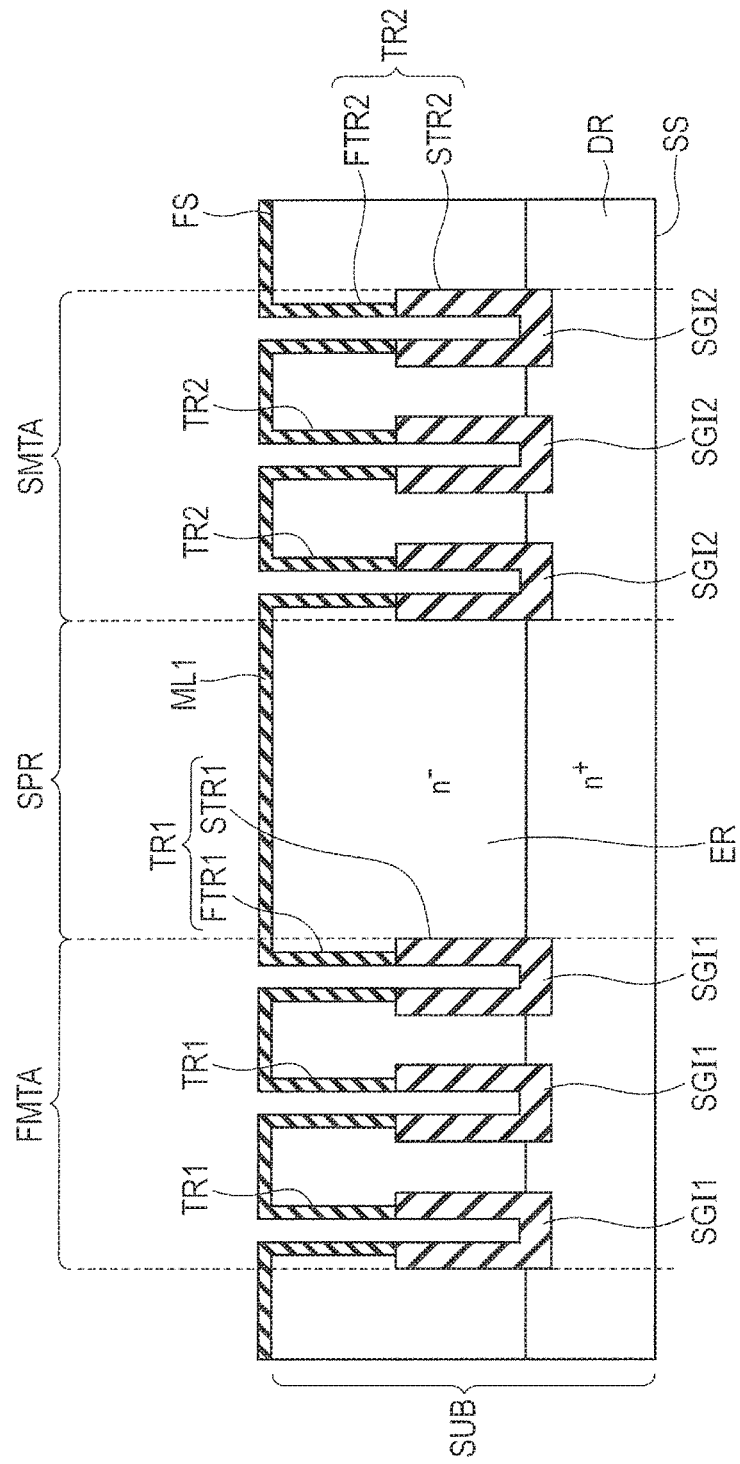
FIG. 8 is a sectional view which shows the fourth step of the method for manufacturing the semiconductor device according to the first embodiment.

As shown in FIG. 8, the semiconductor substrate SUB is oxidized in an oxidative atmosphere while the mask layer ML1 remains intact. The wall faces of the first deeper trench portion STR1 and second deeper trench portion STR2 which are exposed from the mask layer ML1 are oxidized by this oxidation. Consequently, an insulating layer SGI1 as a silicon oxide film is formed on the wall face of the first deeper trench portion STR1 and an insulating layer SGI2 as a silicon oxide film is formed on the wall face of the second deeper trench portion STR2. Then, the mask layer ML1 is selectively removed by etching.

Figure 9:
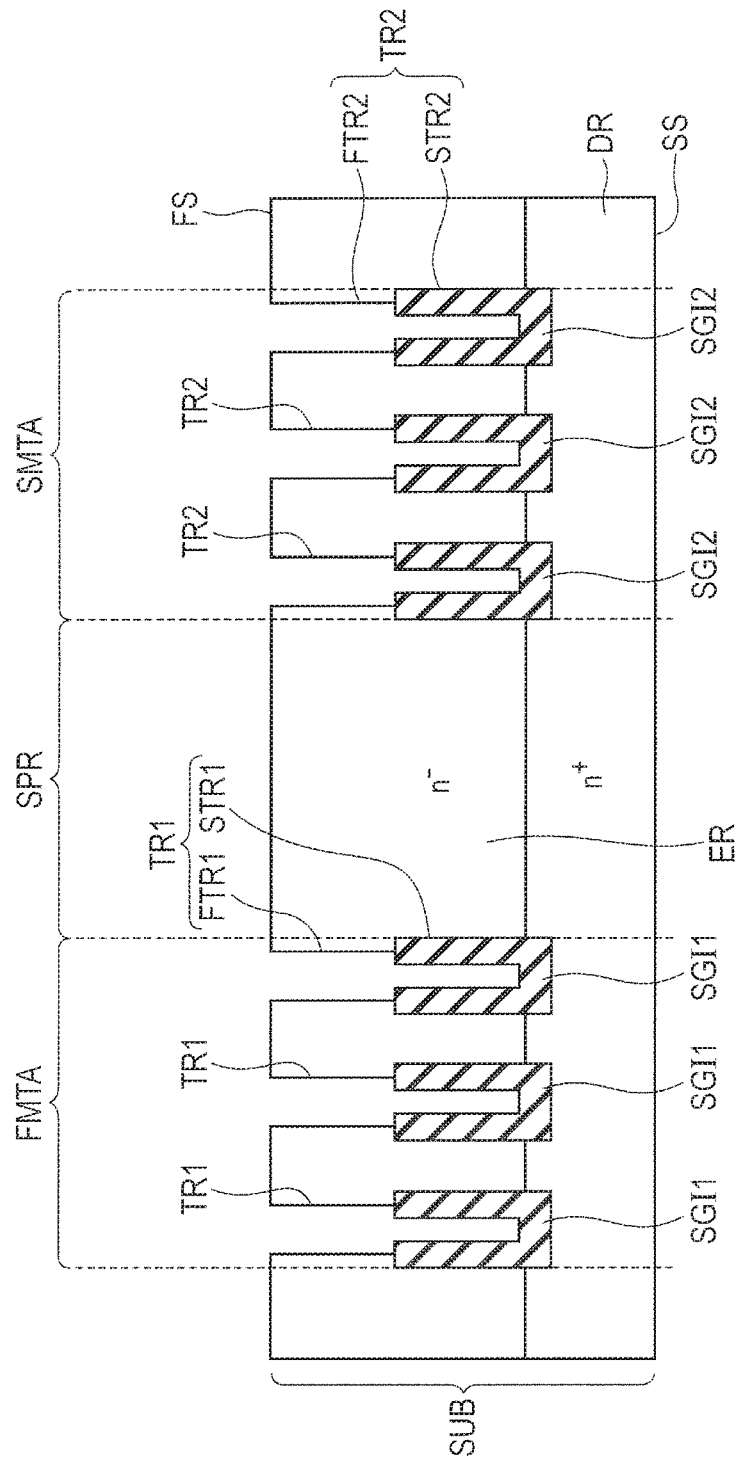
FIG. 9 is a sectional view which shows the fifth step of the method for manufacturing the semiconductor device according to the first embodiment.

As shown in FIG. 9, as a result of etching of the mask layer ML1 as mentioned above, the first surface FS of the semiconductor substrate SUB and the wall face of the first shallower trench portion FTR1 and the wall face of the second shallower trench portion FTR2 are exposed.

Figure 10:
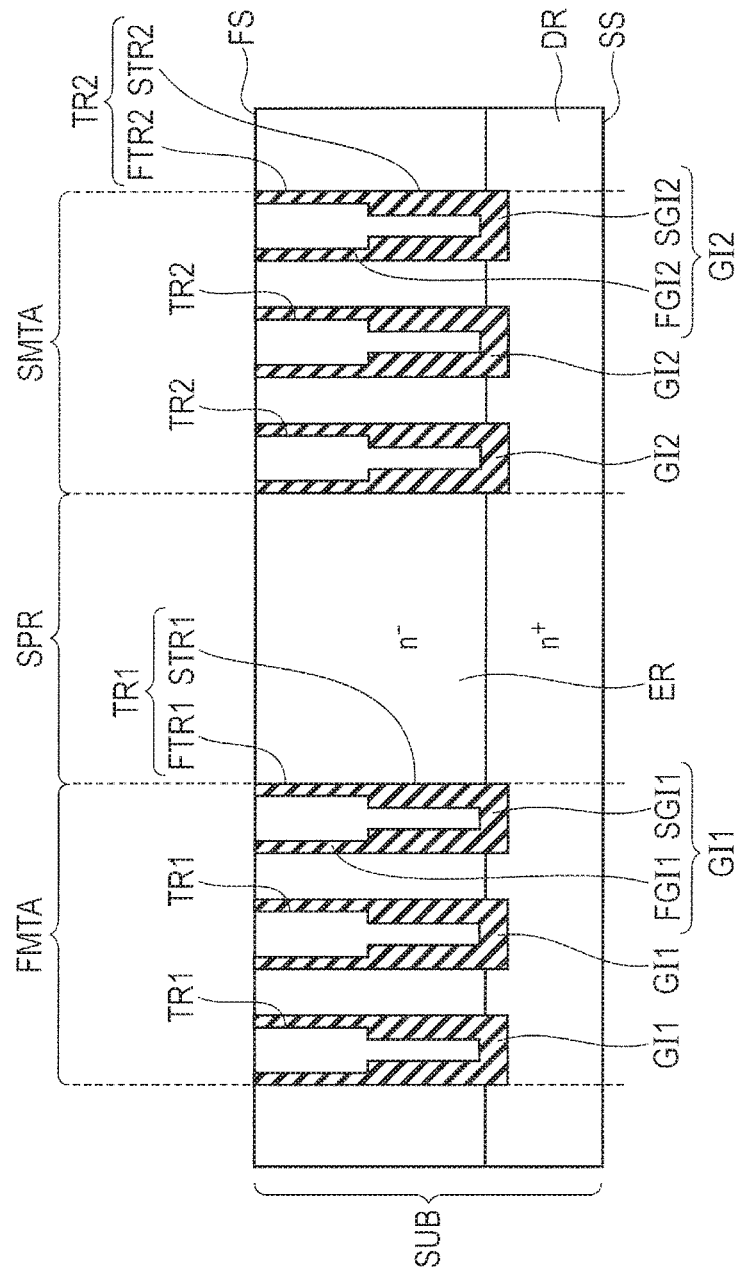
FIG. 10 is a sectional view which shows the sixth step of the method for manufacturing the semiconductor device according to the first embodiment.

As shown in FIG. 10, the wall face of the first shallower trench portion FTR1 and the wall face of the second shallower trench portion FTR2 are oxidized. Consequently, an insulating layer FGI1 as a silicon oxide film is formed on the wall face of the first shallower trench portion FTR1 and an insulating layer FGI2 as a silicon oxide film is formed on the wall face of the second shallower trench portion FTR2.

The insulating layer FGI1 is formed so as to be thinner than the insulating layer SGI1. The insulating layer FGI1 and insulating layer SGI1 make up a first gate insulating layer GI1. The insulating layer FGI2 is formed so as to be thinner than the insulating layer SGI2. The insulating layer FGI2 and insulating layer SGI2 make up a second gate insulating layer GI2.

Figure 11:
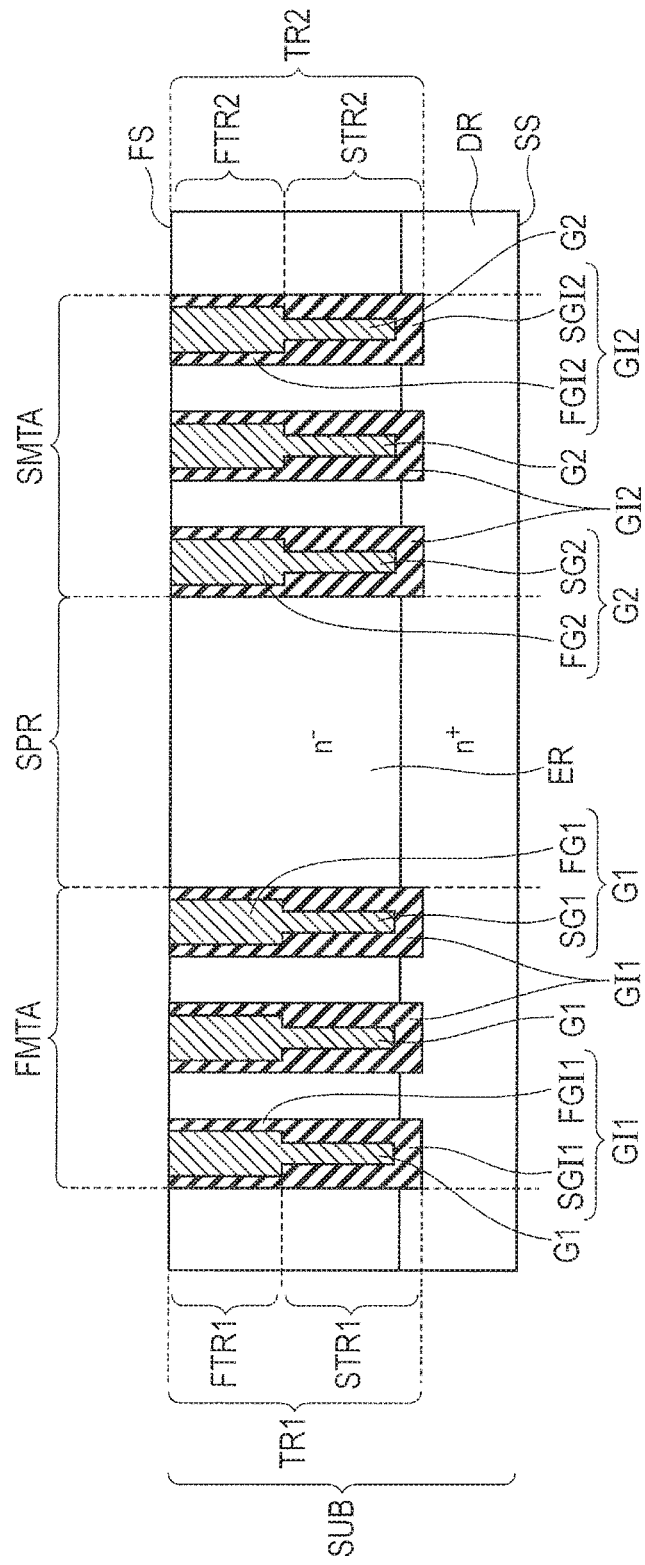
FIG. 11 is a sectional view which shows the seventh step of the method for manufacturing the semiconductor device according to the first embodiment.

As shown in FIG. 11, a first gate electrode G1 is formed inside the first gate trench TR1. The first gate electrode G1 is formed so that the portion FG1 buried in the first shallower trench portion FTR1 has a larger width than the portion SG1 buried in the first deeper trench portion STR1.

Similarly, a second gate electrode G2 is formed inside the second gate trench TR2. The second gate electrode G2 is formed so that the portion FG2 buried in the second shallower trench portion FTR2 has a larger width than the portion SG2 buried in the second deeper trench portion STR2.

Figure 12:
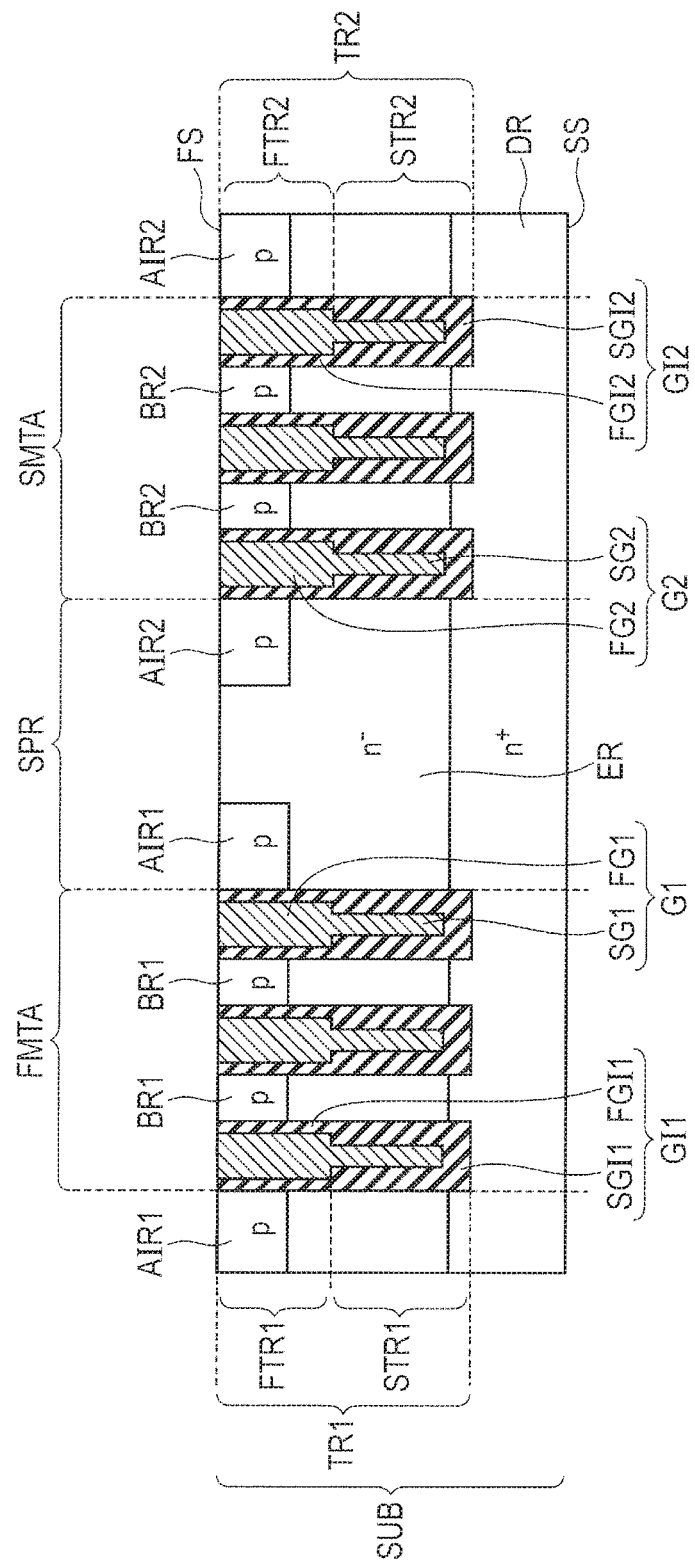
FIG. 12 is a sectional view which shows the eighth step of the method for manufacturing the semiconductor device according to the first embodiment.

As shown in FIG. 12, p-type impurities are implanted in the first surface FS of the semiconductor substrate SUB, for example, by the ion implantation technique. Consequently, a first base region BR1, second base region BR2, first impurity region AIR1, and second impurity region AR2 are formed in the first surface FS of the semiconductor substrate SUB. The first base region BR1, second base region BR2, first impurity region AIR1, and second impurity region AR2 are formed at the same ion implantation step.

The first base region BR1 is located in the first surface FS between first gate trenches TR1 in the first MOS transistor area FMTA. The first impurity region AIR1 is located in the first surface FS outside the first MOS transistor area FMTA in a manner to abut on the side wall of the first gate trench TR1.

The second base region BR2 is located in the first surface FS between second gate trenches TR2 in the second MOS transistor area SMTA. The second impurity region AIR2 is located in the first surface FS outside the second MOS transistor area SMTA in a manner to abut on the side wall of the second gate trench TR2.

Figure 13:
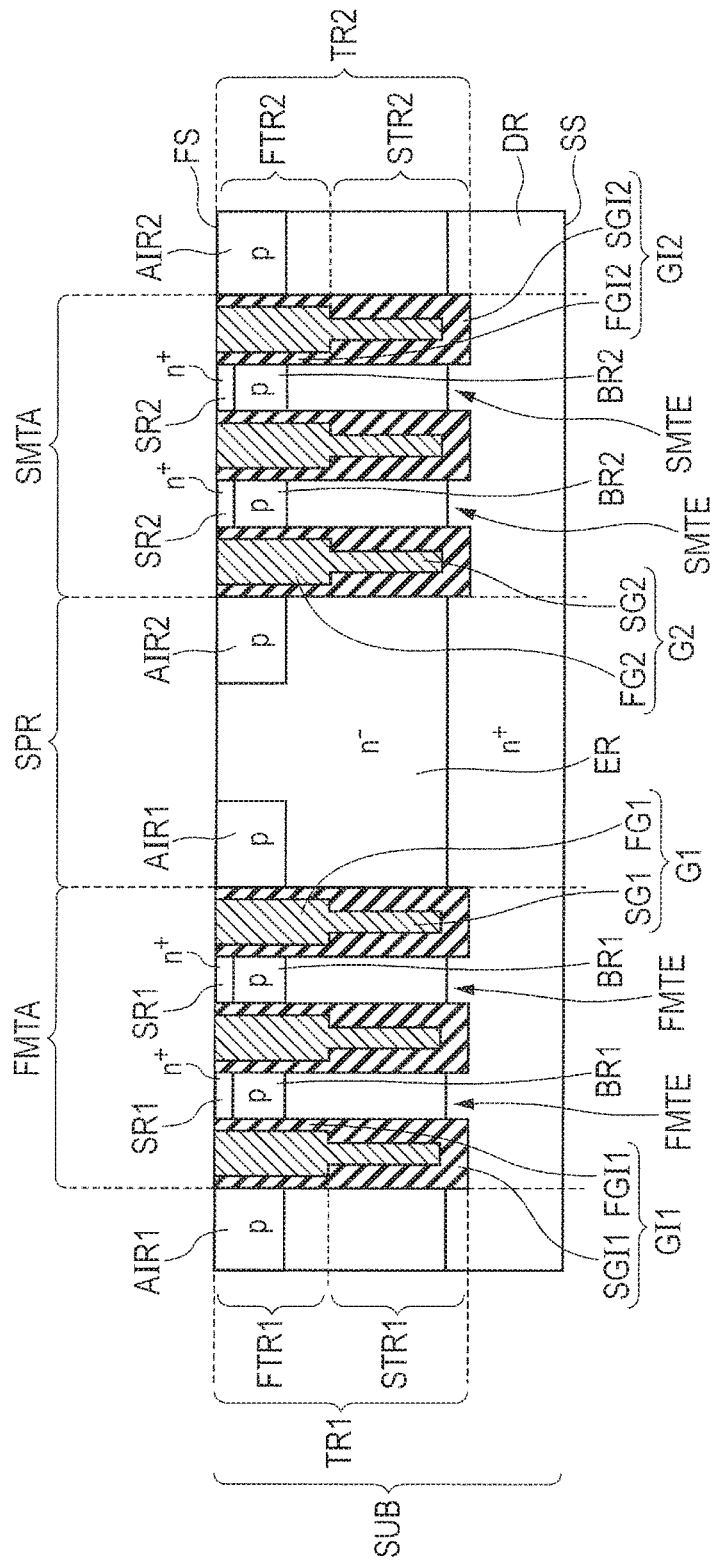
FIG. 13 is a sectional view which shows the ninth step of the method for manufacturing the semiconductor device according to the first embodiment.

As shown in FIG. 13, n-type impurities are implanted in the first surface FS of the semiconductor substrate SUB, for example, by the ion implantation technique. Consequently, a first source region SR1 and second source region SR2 are formed in the first surface FS of the semiconductor substrate SUB.

The first source region SR1 is located in the first surface FS between first gate trenches TR1 in the first MOS transistor area FMTA to make a PN junction with the first base region BR1. The second source region SR2 is located in the first surface FS between second gate trenches TR2 in the second MOS transistor area SMTA to make a PN junction with the second base region BR2.

Consequently, a first MOS transistor element FMTE which includes a first drain region DR, first source region SR1, and first gate electrode G1 is formed. Similarly, a second MOS transistor element SMTE which includes a second drain region DR, second source region SR2, and second gate electrode G2 is formed.

Figure 14:
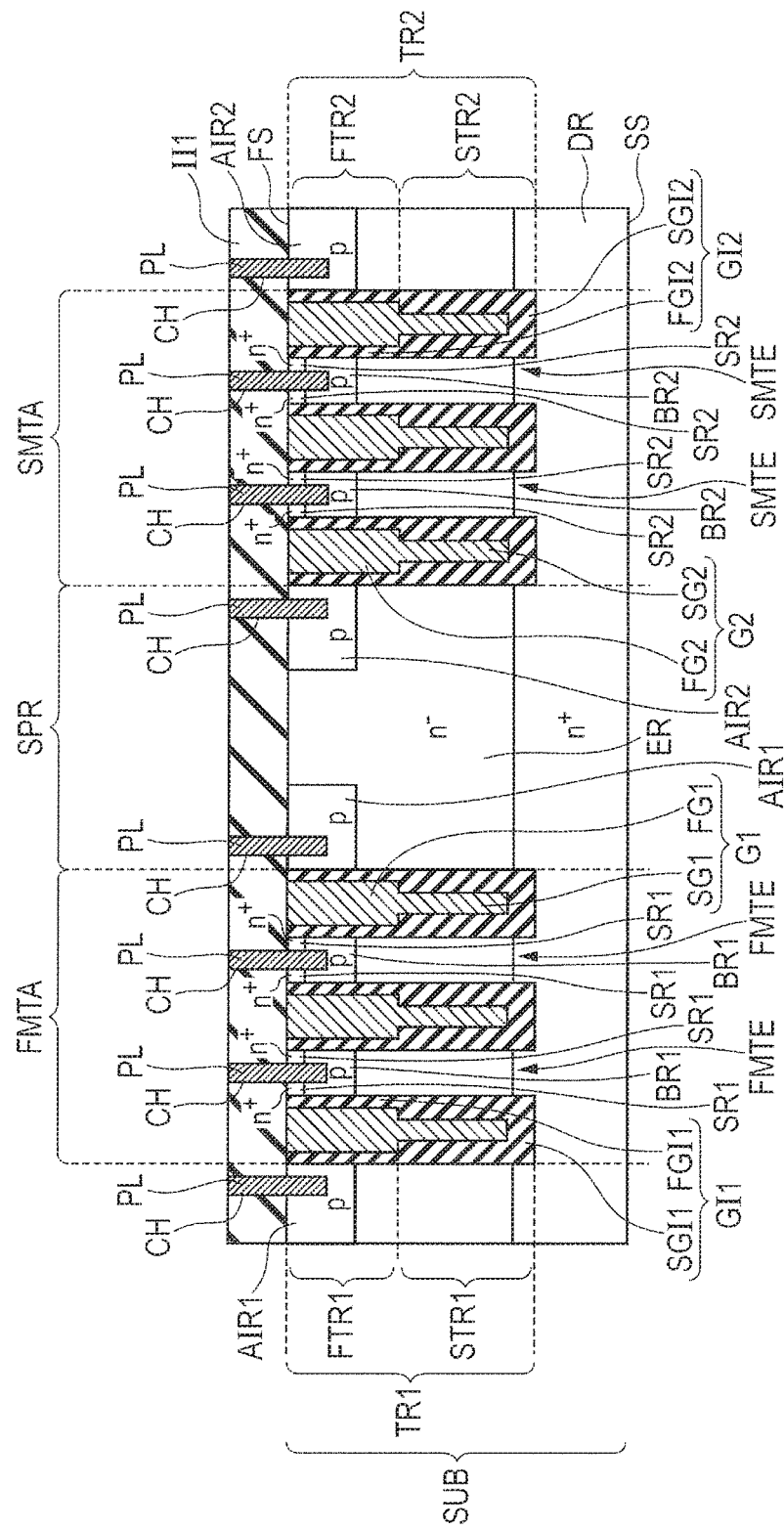
FIG. 14 is a sectional view which shows the tenth step of the method for manufacturing the semiconductor device according to the first embodiment.

As shown in FIG. 14, an interlayer insulating layer II1 is formed over the first surface FS of the semiconductor substrate SUB. Then, a plurality of contact holes CH are made in the interlayer insulating layer II1 by the ordinary photoengraving technique and etching technique.

A contact hole CH in the first MOS transistor area FMTA is made so as to penetrate the first source region SR1 and reach the first base region BR1. A contact hole CH in the second MOS transistor area SMTA is made so as to penetrate the second source region SR2 and reach the second base region BR2.

Furthermore, a contact hole CH which reaches the first impurity region AIR1 and a contact hole CH which reaches the second impurity region AIR2 are made.

As shown in FIG. 4, a first source electrode S1 and a second source electrode S2 are formed over the upper surface of the interlayer insulating layer II1. The first source electrode S1 is electrically coupled to the first source region SR1, the first base region BR1, and the first impurity region AIR1. The second source electrode S2 is electrically coupled to the second source region SR2, the second base region BR2, and the second impurity region AIR2.

After that, an interlayer insulating layer II2 is formed over the interlayer insulating layer II1 so as to cover the first source electrode S1 and second source electrode S2. The semiconductor device according to the first embodiment is thus manufactured.

Figure 15:
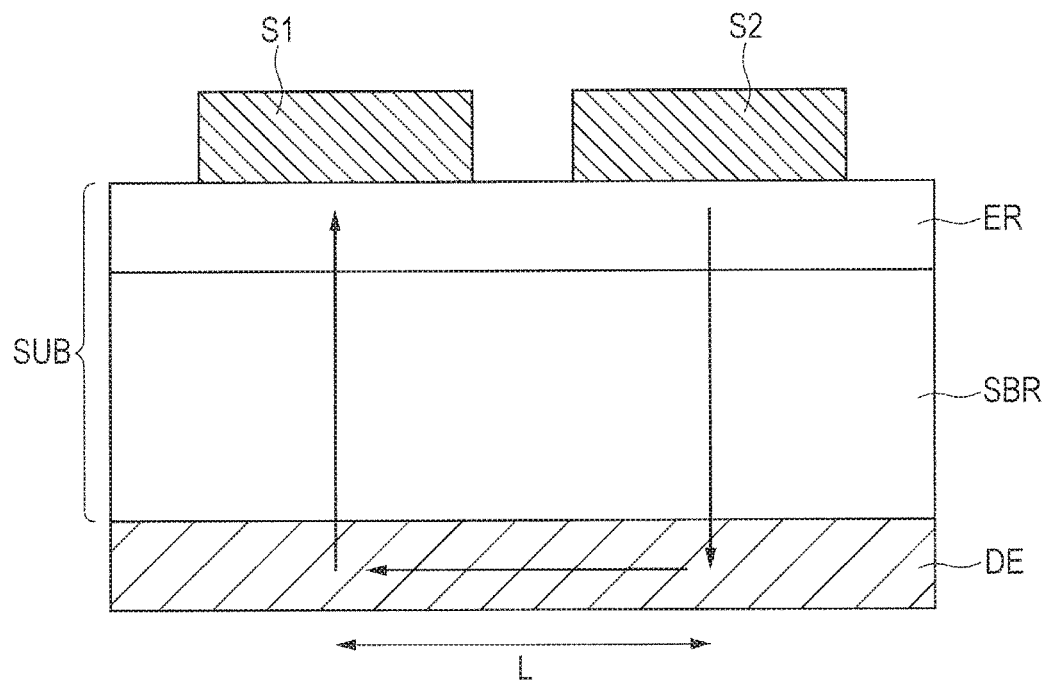
FIG. 15 is a sectional view which explains the on-state current pathway in Comparative Example 1.

Next, the effects of the first embodiment will be explained by comparison with Comparative Example 1 shown in FIG. 15, Comparative Example 2 shown in FIG. 17, and Comparative Example 3 shown in FIG. 18.

In Comparative Example 1 shown in FIG. 15, a back electrode (drain electrode) is formed on the back surface of the semiconductor substrate SUB. In FIG. 15, transistors are not illustrated for the sake of explanatory convenience.

In Comparative Example 1, on-state current flows vertically from the second source electrode S2 on the front surface side of the semiconductor substrate SUB to the back electrode DE along the arrows in the figure, then flows horizontally in the back electrode DE, and then flows vertically from the back electrode DE to the first source electrode S1. Comparative Example 1 has a drawback that the on-state current pathway is long and the on-resistance cannot be decreased easily.

The on-resistance mainly includes the following components: the resistance of the channel region, the resistance of the epitaxial region, and the resistance of the substrate region when the on-state current flows vertically, and the metal resistance when it flows in the back electrode DE. In order to decrease the resistance components, it is desirable to make the thickness of the semiconductor substrate SUB as small as possible. However, doing so may cause the semiconductor substrate SUB to crack or warp easily. In addition, if a low-resistance back electrode DE is formed from thick metal, the process to form it should be complicated and disadvantageous in terms of cost.

In order to avoid the above drawback, Japanese Unexamined Patent Application Publication No. 2006-147700 discloses a structure in which a first MOS transistor element and a second MOS transistor element are arranged adjacent to each other alternately in one chip. In this structure, the on-state current between the first MOS transistor element and the second MOS transistor element flows not in the back electrode but along the trench bottom. This offers an advantage that it is unnecessary to form a low-resistance back electrode. However, this structure has a drawback that since the trench bottom includes an epitaxial layer, the resistance of the high-resistance epitaxial region is added to the on-resistance in the horizontal pathway.

In the structure in which a first MOS transistor element and a second MOS transistor element are arranged alternately, the rise in on-resistance can be minimized. However, a source electrode must be formed within the horizontal size of the transistor, which would be difficult and unrealistic. In addition, with the increasing tendency toward cell shrinkage for higher density, it would be more difficult to form a source electrode.

In order to avoid this problem, the present inventors conceived a structure in which one first source electrode is electrically coupled to a plurality of first MOS transistor elements and one second source electrode is electrically coupled to a plurality of second MOS transistor elements, and the first source electrode and the second source electrode are arranged alternately.

Figure 16:
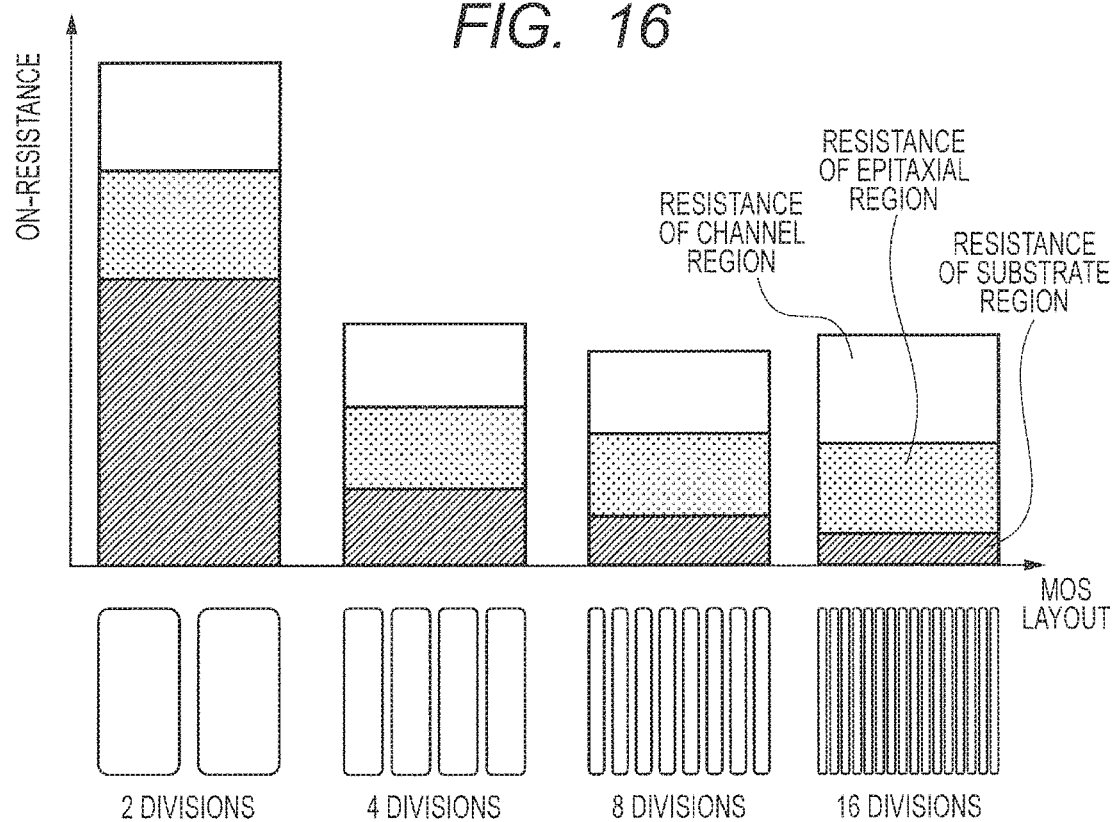
FIG. 16 is a diagram which shows how the resistance changes depending on the number of divisions of the first MOS transistor and second MOS transistor.

The present inventors made a simulation to see how the on-resistance changes according to the number of divisions of a MOS transistor without a back electrode. FIG. 16 shows the result of the simulation.

As shown in FIG. 16, when the number of divisions of a MOS transistor is larger, the resistance of the substrate region is lower. When the number of divisions is too large, the resistance of the channel region and the resistance of the epitaxial region increase though the resistance of the substrate region decreases. This is because the temporarily set width of separation between the first MOS transistor element and second MOS transistor element is large and thus when the number of divisions is large, the MOS transistor area is decreased.

In order to increase the number of divisions, it is important to decrease the width of separation between the first MOS transistor element and second MOS transistor element.

Figure 17:
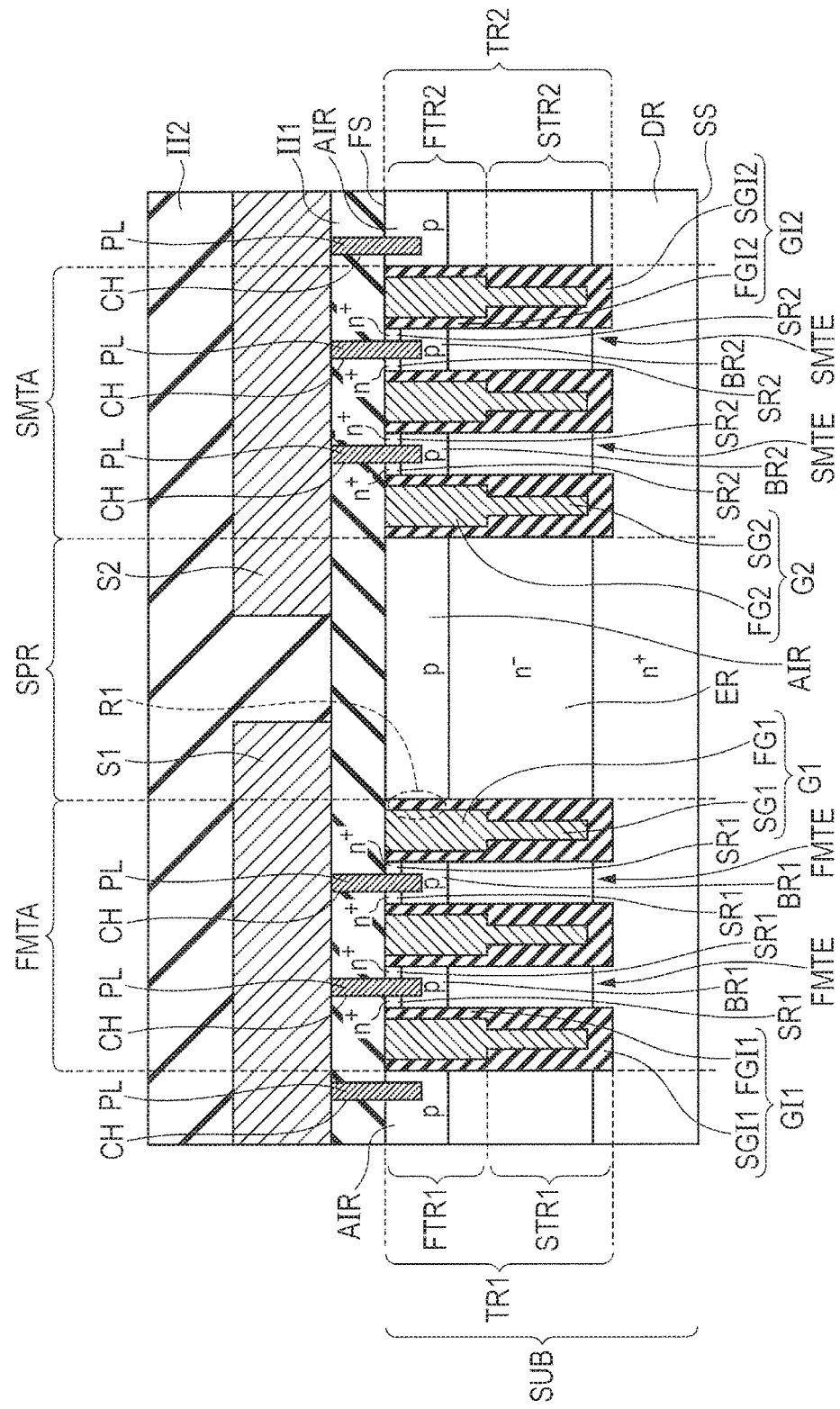
FIG. 17 is a sectional view which shows the structure of the semiconductor device in Comparative Example 2.

In the structure of Comparative Example 2 shown in FIG. 17, an impurity region AIR with a floating potential is located in the first surface FS in the separation area SPR. In the structure of Comparative Example 2, when the first MOS transistor is off, the high drain-source voltage is applied to the thin first thinner film portion FGI1 (region R1) on the outermost of the first MOS transistor area FMTA. For this reason, the first thinner film portion FGI1 cannot be thinned and it is difficult to decrease the width of the separation area SPR.

Figure 18:
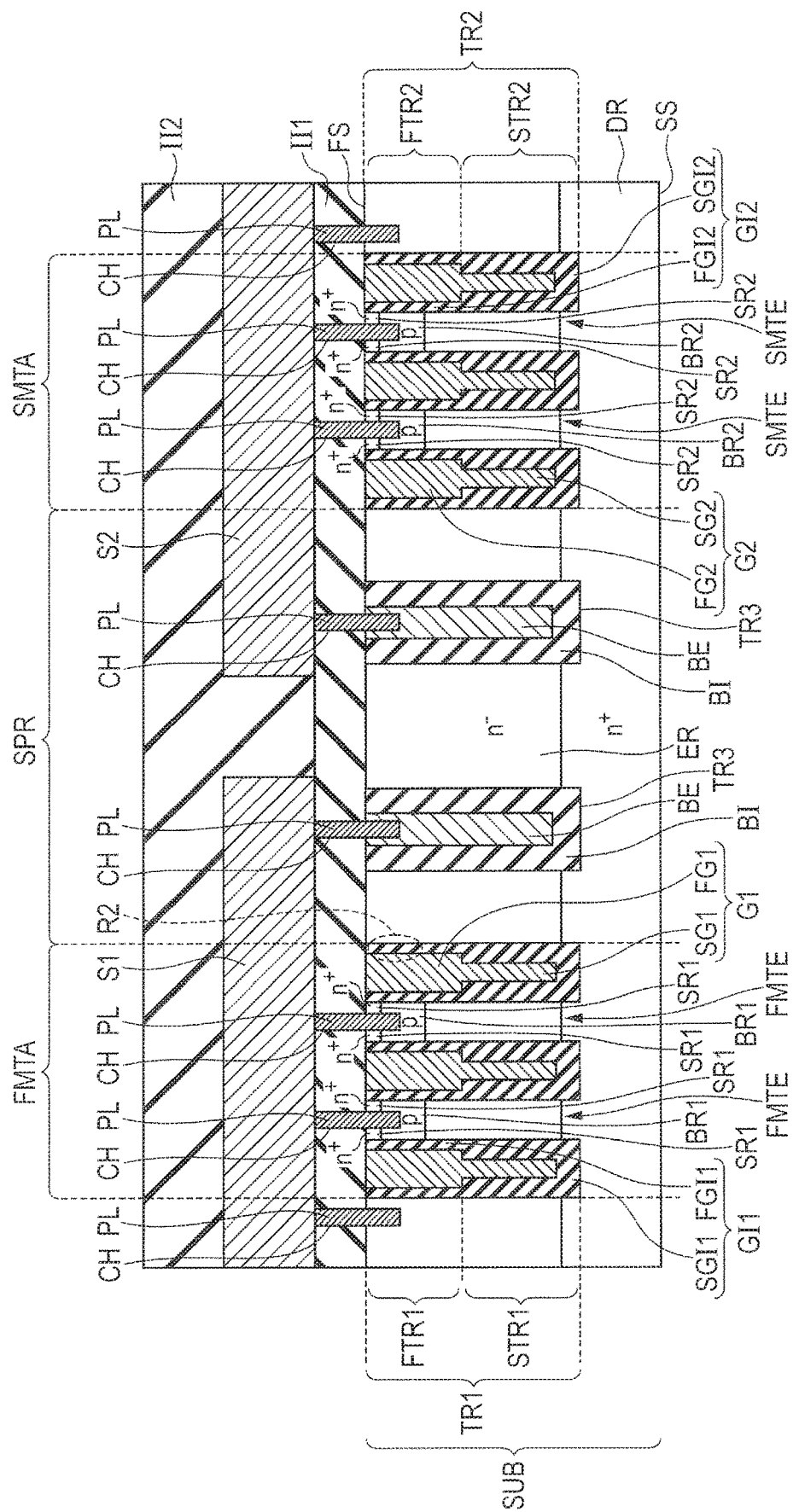
FIG. 18 is a sectional view which shows the structure of the semiconductor device in Comparative Example 3.

In the structure of Comparative Example 3 shown in FIG. 18, a trench TR3 is made in the first surface FS in the separation area SPR and an insulating layer BI and a conductive layer BE are buried in the trench TR3. The electric field applied to the thin first thinner film portion FGI1 (region R2) can be mitigated by thickening the insulating layer BI and letting the conductive layer BE have the source potential. However, it is necessary to form the trench TR3, insulating layer BI, and conductive layer BE, which poses the problem that the number of manufacturing steps is increased and the width of separation should be larger.

By contrast, in the first embodiment, as shown in FIG. 4, in the first surface FS in the separation area SPR, the first impurity region AIR1 electrically coupled to the first source electrode S1 abuts on the wall face of the first shallower trench portion FTR1 of the first gate trench TR1. In other words, the first impurity region AIR1 with the source potential abuts on the thin first thinner film portion FGI1.

Consequently, the high drain-source voltage to be applied with the first MOS transistor element FMTE off is applied to the junction between the epitaxial region ER with the drain potential and the first impurity region AIR1 with the source potential. Therefore, the depletion layer generated at the junction shares the electric field. Consequently, only the gate-source potential is applied to the first gate insulating layer GI1, thereby allowing the thin first thinner film portion FGI1 of the first gate insulating layer GI1 to be thinned. Thus, the on-resistance can be decreased.

In addition, since the thin first thinner film portion FGI1 of the first gate insulating layer GI1 can be thinned, the width of separation between the first MOS transistor area FMTA and second MOS transistor area SMTA can be decreased. When the width of separation is smaller, the number of divisions can be larger to decrease the on-resistance according to the simulation result shown in FIG. 16. In other words, when the number of divisions is larger, the current flow distance from the first MOS transistor area FMTA to the second MOS transistor area SMTA is shorter and thus the on-resistance is lower.

Furthermore, since the on-resistance can be decreased as mentioned above, it is unnecessary to form a back electrode (drain electrode) made of metal on the second surface SS.

As shown in FIG. 12, the first impurity region AIR1 can be formed at the same step as the first base region BR1. This eliminates the need to increase the number of steps as in Comparative Example 3 shown in FIG. 18, and simplifies the process to manufacture the semiconductor device according to the first embodiment.

The width of separation between the first MOS transistor area FMTA and second MOS transistor area SMTR can be further decreased by forming the second MOS transistor SMTR in the same way as the first MOS transistor FMTR.

The first impurity region AIR1 and the second impurity region AIR2 are separated from each other. Therefore, the first impurity region AIR1 can have the same potential as the first source region SR1 and the second impurity region AIR2 can have the same potential as the second source region SR2. This means that the first impurity region AIR1 and the second impurity region AIR2 can be controlled at different potentials.

The first impurity region AIR1 has the same depth from the first surface FS as the first base region BR1 and has the same impurity concentration as the first base region BR1. This makes it possible to form the first impurity region AIR1 and the first base region BR1 at the same step, thereby simplifying the process to manufacture the semiconductor device according to the first embodiment as mentioned above.

The second impurity region AIR2 has the same depth from the first surface FS as the second base region BR2 and has the same impurity concentration as the second base region BR2. This makes it possible to form the second impurity region AIR2 and the second base region BR2 at the same step, thereby simplifying the process to manufacture the semiconductor device according to the first embodiment as mentioned above.

Second Embodiment

Figure 19:
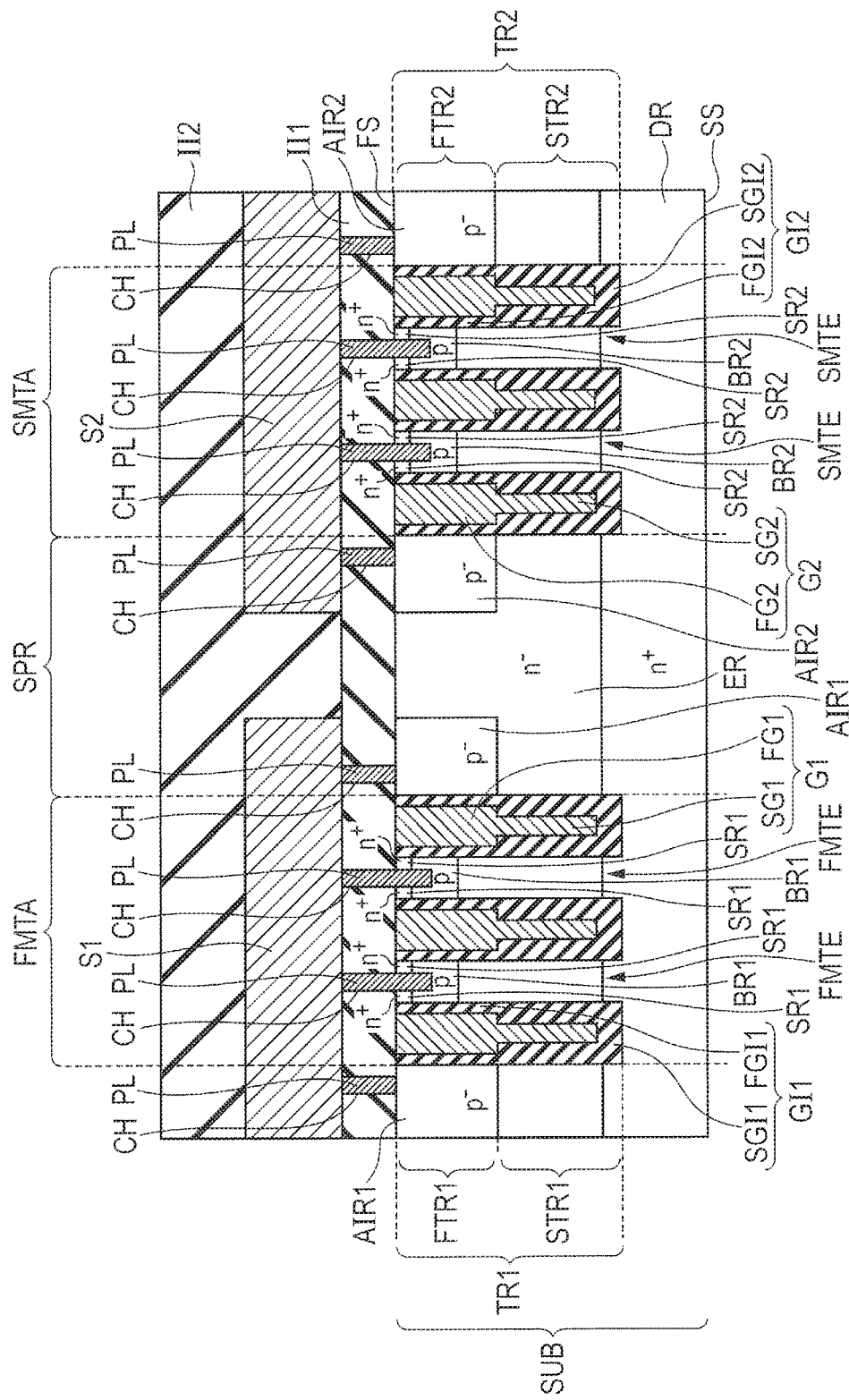
FIG. 19 is a sectional view which shows the structure of the semiconductor device according to the second embodiment.

As shown in FIG. 19, the semiconductor device according to the second embodiment is structurally different from the semiconductor device according to the first embodiment as shown in FIG. 4 in the first impurity region AIR1, second impurity region AIR2, and plug conductive layer PL.

The first impurity region AIR1 has a larger depth from the first surface FS than the first base region BR1 and has a lower impurity concentration than the first base region BR1. The first impurity region AIR1 may extend from the first surface FS deeper than the first depth position or extend to the same depth position as the first depth position.

The second impurity region AIR2 has a larger depth from the first surface FS than the second base region BR2 and has a lower impurity concentration than the second base region BR2. The second impurity region AIR2 may extend from the first surface FS deeper than the first depth position or extend to the same depth position as the first depth position.

The first impurity region AIR1 and second impurity region AIR2 extend to the same depth position.

The plug conductive layer PL (first conductive layer) which couples the first source electrode S1 and the first source region SR1 extends into the semiconductor substrate SUB from the first surface FS deeper than the plug conductive layer PL (second conductive layer) which couples the first source electrode S1 and the first impurity region AIR1.

The plug conductive layer PL which couples the second source electrode S2 and the second source region SR2 extends into the semiconductor substrate SUB from the first surface FS deeper than the plug conductive layer PL which couples the second source electrode S2 and the second impurity region AIR2.

The elements other than the above in the second embodiment are virtually the same as in the first embodiment and the same elements as in the first embodiment are designated by the same reference signs and description thereof is not repeated here.

Next, the method for manufacturing the semiconductor device according to the second embodiment will be described referring to FIGS. 19 to 24.

Figure 20:
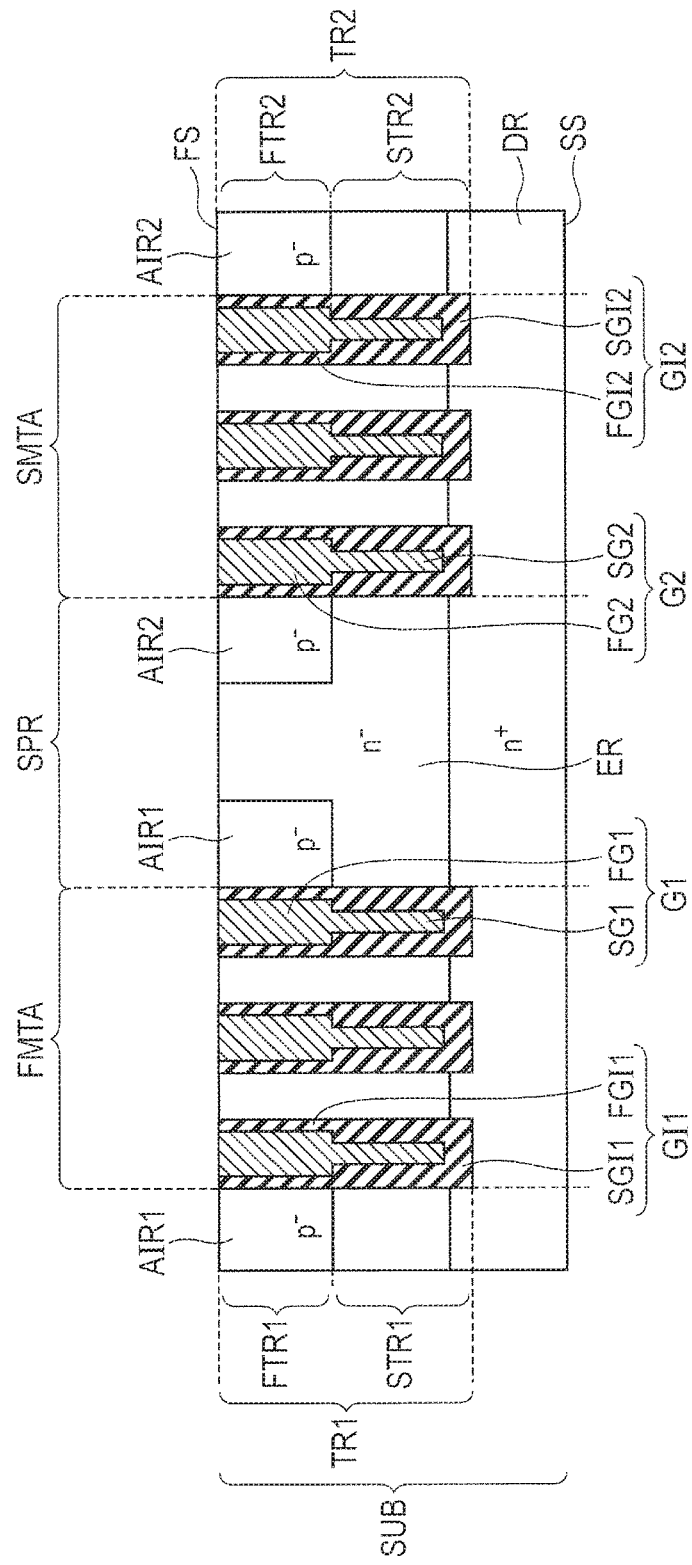
FIG. 20 is a sectional view which shows the first step of the method for manufacturing the semiconductor device according to the second embodiment.

In the method for manufacturing the semiconductor device according to the second embodiment, first, the same steps as those shown in FIGS. 5 to 11 according to the first embodiment are carried out. After that, as shown in FIG. 20, p-type impurities are implanted in the first surface FS of the semiconductor substrate SUB, for example, by the ion implantation technique. Consequently, a first impurity region AIR1 and a second impurity region AIR2 are formed in the first surface FS of the semiconductor substrate SUB. The first impurity region AIR1 and second impurity region AIR2 are formed at the same ion implantation step separately from each other.

The first impurity region AIR1 is located in the first surface FS outside the first MOS transistor area FMTA in a manner to abut on the side wall of the first gate trench TR1. The second impurity region AIR2 is located in the first surface FS outside the second MOS transistor area SMTA in a manner to abut on the side wall of the second gate trench TR2.

Figure 21:
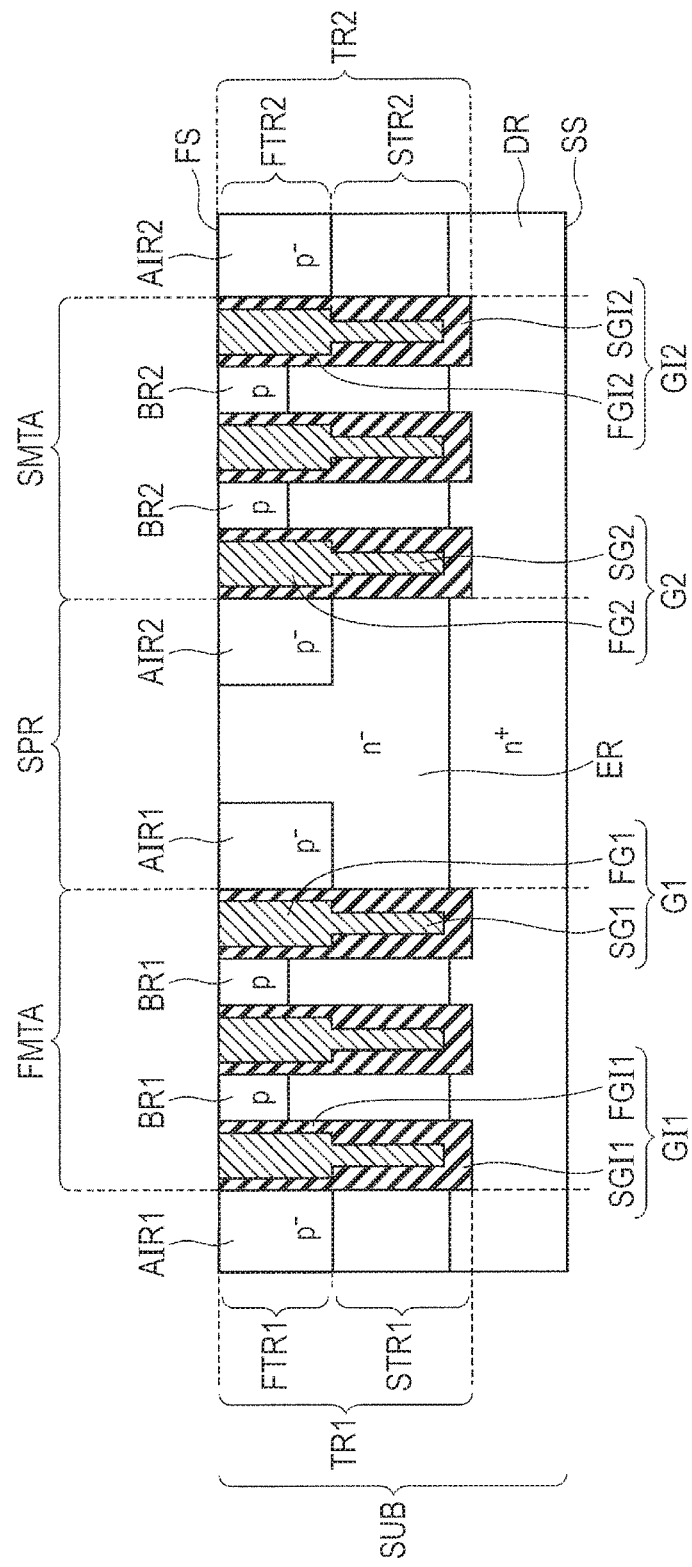
FIG. 21 is a sectional view which shows the second step of the method for manufacturing the semiconductor device according to the second embodiment.

As shown in FIG. 21, p-type impurities are implanted in the first surface FS of the semiconductor substrate SUB, for example, by the ion implantation technique. Consequently, a first base region BR1 and a second base region BR2 are formed in the first surface FS of the semiconductor substrate SUB. The first base region BR1 and the second base region BR2 are formed at the same ion implantation step.

The first base region BR1 is located in the first surface FS between first gate trenches TR1 in the first MOS transistor area FMTA. The first base region BR1 is formed so as to have a smaller depth and a lower p-type impurity concentration than the first impurity region AIR1.

The second base region BR2 is located in the first surface FS between second gate trenches TR2 in the second MOS transistor area SMTA. The second base region BR2 is formed so as to have a smaller depth and a lower p-type impurity concentration than the second impurity region AIR2.

Figure 22:
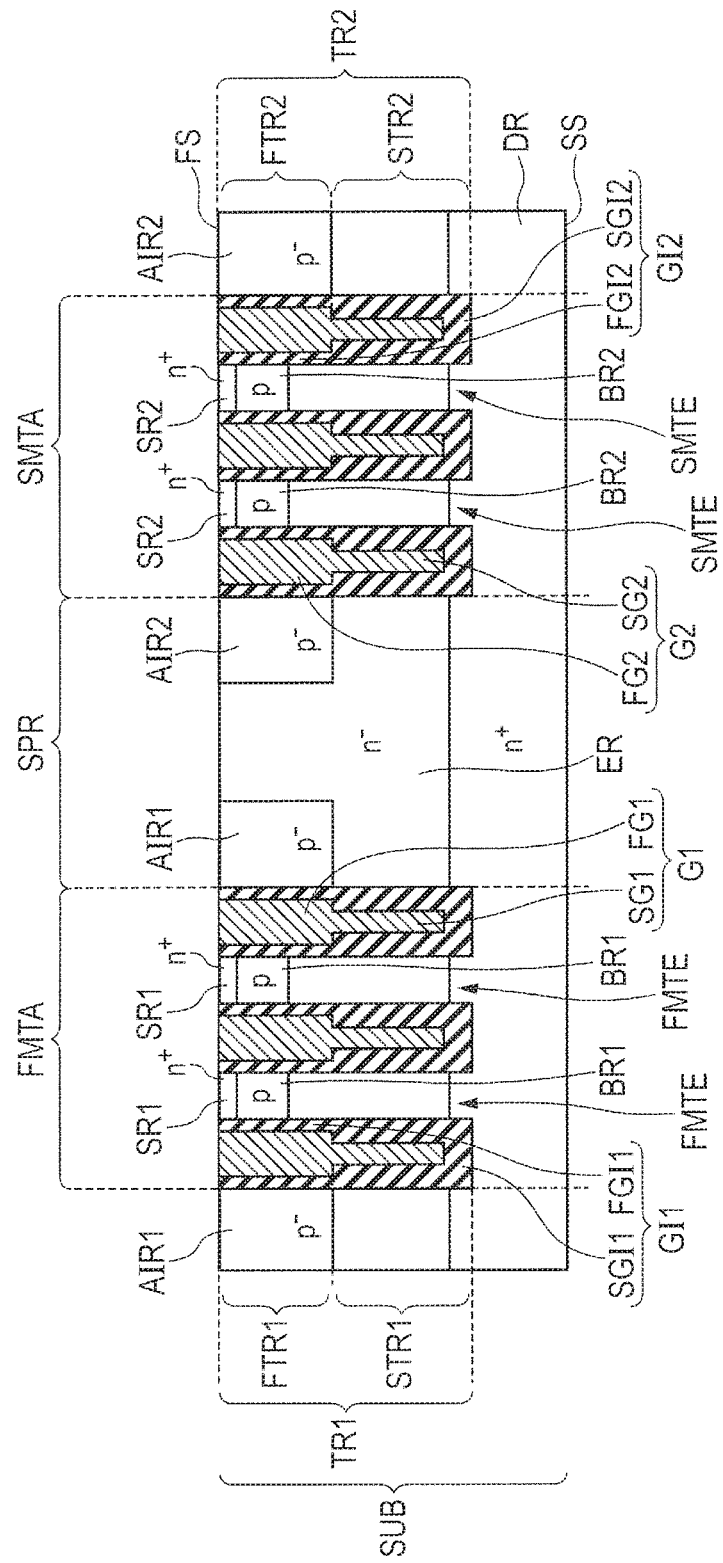
FIG. 22 is a sectional view which shows the third step of the method for manufacturing the semiconductor device according to the second embodiment.

As shown in FIG. 22, n-type impurities are implanted in the first surface FS of the semiconductor substrate SUB, for example, by the ion implantation technique. Consequently, a first source region SR1 and a second source region SR2 are formed in the first surface FS of the semiconductor substrate SUB.

The first source region SR1 is located in the first surface FS between first gate trenches TR1 in the first MOS transistor area FMTA to make a PN junction with the first base region BR1. The second source region SR2 is located in the first surface FS between second gate trenches TR2 in the second MOS transistor area SMTA to make a PN junction with the second base region BR2.

Consequently, a first MOS transistor element FMTE which includes the first drain region DR, first source region SR1, and first gate electrode G1 is formed. Similarly, a second MOS transistor element SMTE which includes the second drain region DR, second source region SR2, and second gate electrode G2 is formed.

Figure 23:
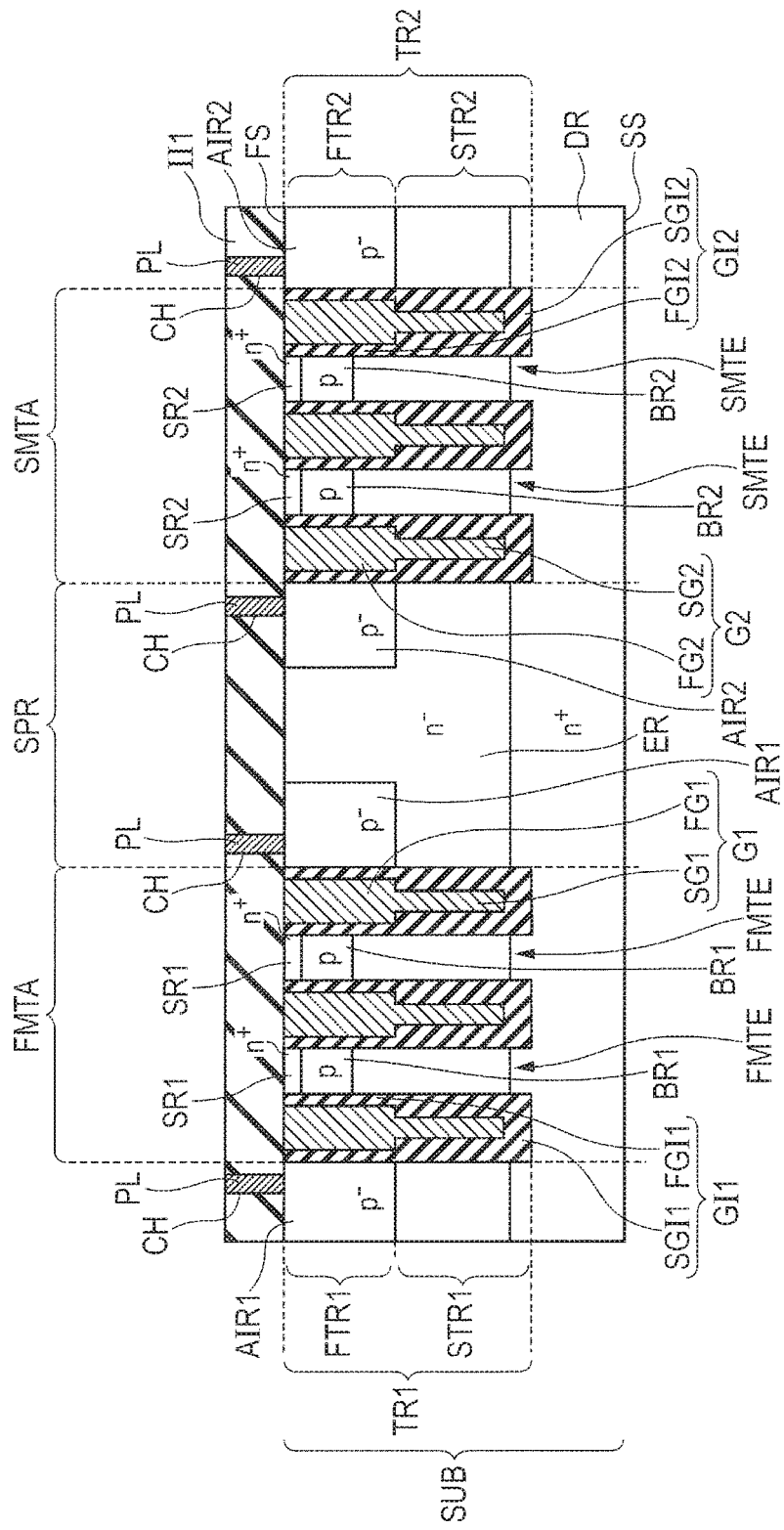
FIG. 23 is a sectional view which shows the fourth step of the method for manufacturing the semiconductor device according to the second embodiment.

As shown in FIG. 23, an interlayer insulating layer II1 is formed over the first surface FS of the semiconductor substrate SUB. Then, a plurality of contact holes CH are made in the interlayer insulating layer II1 by the ordinary photoengraving technique and etching technique. The contact holes CH include contact holes CH which reach the first impurity region AIR1 and contact holes CH which reach the second impurity region AIR2. A plug conductive layer PL is buried in each of these contact holes CH.

Figure 24:
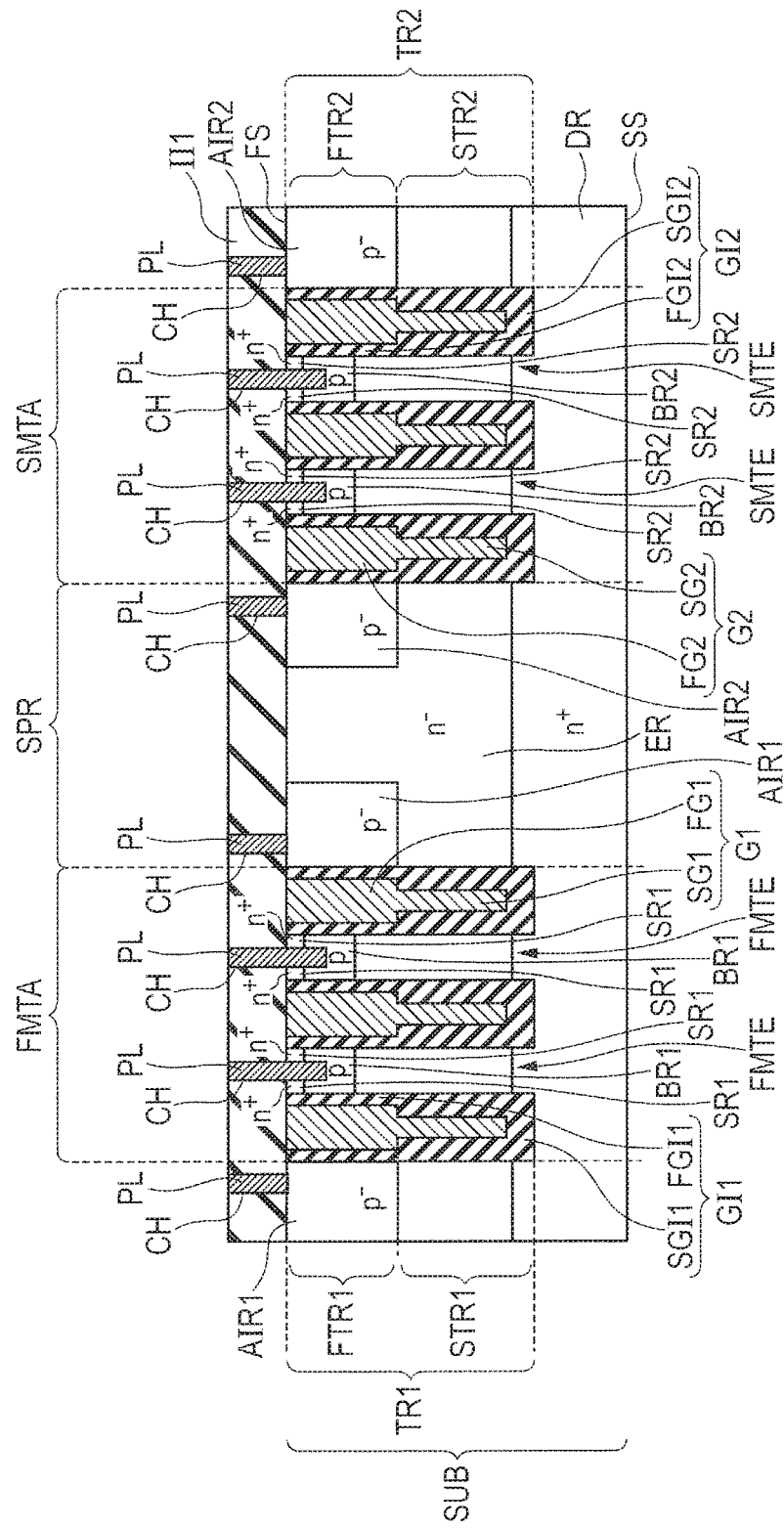
FIG. 24 is a sectional view which shows the fifth step of the method for manufacturing the semiconductor device according to the second embodiment.

As shown in FIG. 24, a plurality of contact holes CH are made in the interlayer insulating layer II1 by the ordinary photoengraving technique and etching technique. The contact holes CH include contact holes CH which penetrate the first source region SR1 and reach the first base region BR1 and contact holes CH which penetrate the second source region SR2 and reach the second base region BR2. A plug conductive layer PL is buried in each of these contact holes CH.

The contact holes CH which reach the first source region SR1 extend into the semiconductor substrate SUB from the first surface FS deeper than the contact holes CH which reach the first impurity region AIR1. The contact holes CH which reach the second source region SR2 extend into the semiconductor substrate SUB from the first surface FS deeper than the contact holes CH which reach the second impurity region AIR2.

As shown in FIG. 19, a first source electrode S1 and a second source electrode S2 are formed over the upper surface of the interlayer insulating layer II1. The first source electrode S1 is electrically coupled to the first source region SR1, first base region BR1, and first impurity region AIR1. The second source electrode S2 is electrically coupled to the second source region SR2, second base region BR2, and second impurity region AIR2.

After that, an interlayer insulating layer 112 is formed over the interlayer insulating layer II1 in a manner to cover the first source electrode S1 and second source electrode S2. The semiconductor device according to the second embodiment is thus manufactured.

Next, the effects of the semiconductor device according to the second embodiment will be explained.

In the second embodiment, as shown in FIG. 19, in the first surface FS outside the first MOS transistor area FMTA, the first impurity region AIR1 electrically coupled to the first source electrode S1 abuts on the wall face of the first shallower trench portion FTR1 of the first gate trench TR1. In other words, the first impurity region AIR1 with the source potential abuts on the thin first thinner film portion FGI1. This brings about the same advantageous effects as the first embodiment.

In addition, the first impurity region AIR1 is formed so as to have a larger depth and a lower p-type impurity concentration than the first base region BR1. Consequently, the depletion layer easily extends from the junction between the first impurity region AIR1 and epitaxial region ER into the first impurity region AIR1, thereby improving the breakdown voltage.

In addition, the contact holes CH which reach the first impurity region AIR1 are made so as to abut on the first surface FS and do not extend from the first surface FS deep into the semiconductor substrate SUB. Therefore, even if a depletion layer extends into the first impurity region AIR1, the depletion layer is restrained from contacting the plug conductive layer PL in the contact hole CH. This also improves the breakdown voltage.

Since the second impurity region AIR2 has the same structure as the first impurity region AIR1, the second impurity region AIR2 also brings about the same advantageous effects as the first impurity region AIR1.

Third Embodiment

Figure 25:
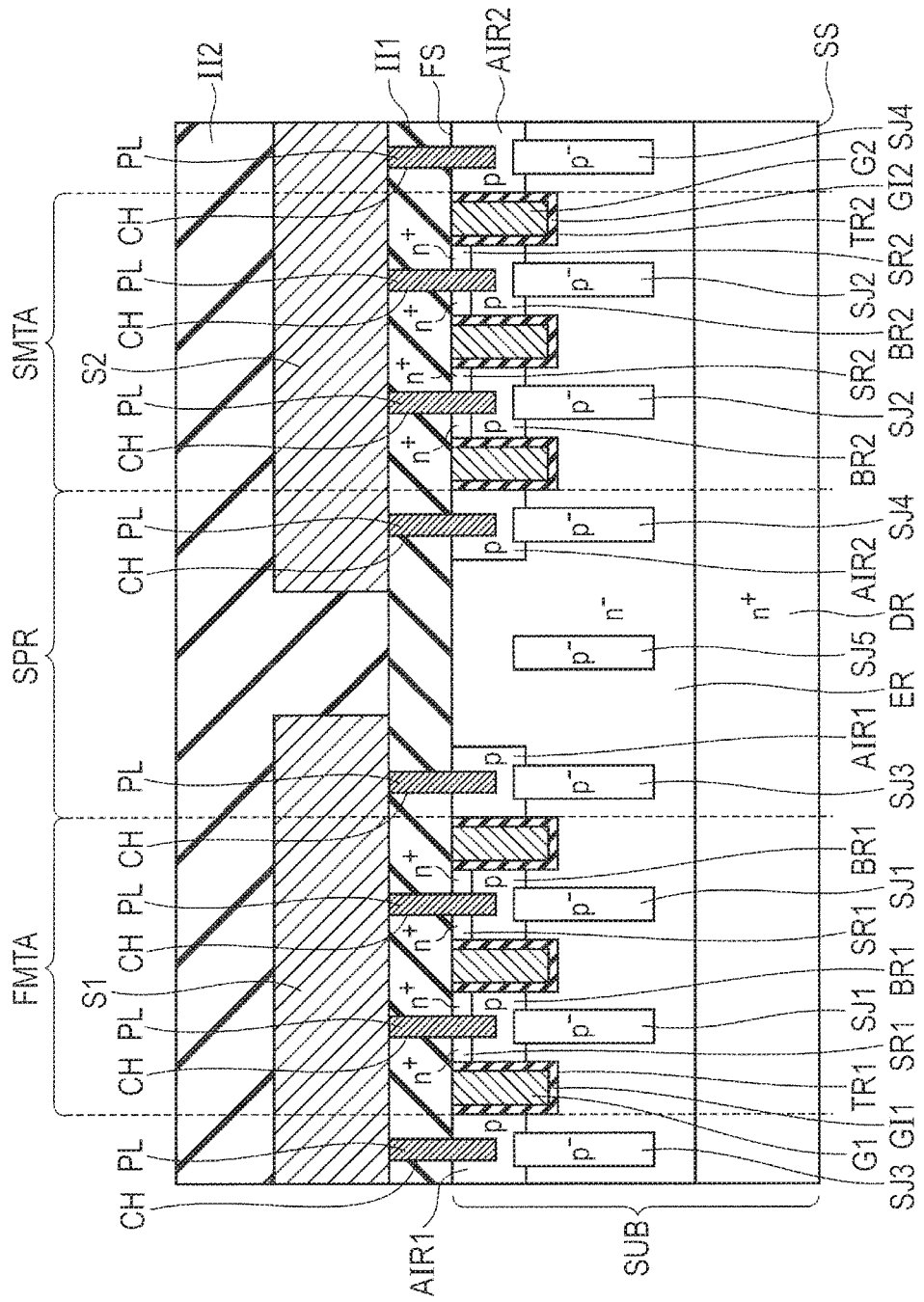
FIG. 25 is a sectional view which shows the structure of the semiconductor device according to the third embodiment.

As shown in FIG. 25, the semiconductor device according to the third embodiment is structurally different from the semiconductor device according to the first embodiment in that the first gate trench TR1 and second gate trench TR2 are different from those in the first embodiment and p⁻ column regions SJ1, SJ2, SJ3, SJ4, and SJ5 are provided.

In the third embodiment, the first gate trench TR1 does not reach the drain region DR. The bottom of the first gate trench TR1 lies inside the epitaxial region ER. The first gate insulating layer GI1 in the first gate trench TR1 has a single thickness. The first gate electrode G1 has a single width.

The second gate trench TR2 does not reach the drain region DR. The bottom of the second gate trench TR2 lies inside the epitaxial region ER. The second gate insulating layer GI2 in the second gate trench TR2 has a single thickness. The second gate electrode G2 has a single width.

The p⁻ column regions SJ1, SJ2, SJ3, SJ4, and SJ5 each have a lower p-type impurity concentration than the p-type impurity concentration of each of the first base region BR1, second base region BR2, first impurity region AIR1, and second impurity region AIR2.

The p⁻ column region SJ1 (first column region) is coupled to the first base region BR1 and extends from the first base region BR1 toward the second surface SS. The p⁻ column region SJ2 (second column region) is coupled to the second base region BR2 and extends from the second base region BR2 toward the second surface SS.

The p⁻ column region SJ3 is coupled to the first impurity region AIR1 and extends from the first impurity region AIR1 toward the second surface SS. The p⁻ column region SJ4 is coupled to the second impurity region AIR2 and extends from the second impurity region AIR2 toward the second surface SS.

The p⁻ column region SJ5 is located in the epitaxial region ER in the separation area SPR between the first MOS transistor area FMTA and second MOS transistor area SMTA. The p⁻ column region SJ5 is surrounded by the epitaxial region ER. The p⁻ column region SJ5 has a floating potential.

The elements other than the above in the third embodiment are virtually the same as in the first embodiment and the same elements as in the first embodiment are designated by the same reference signs and description thereof is not repeated here.

Next, the effects of the semiconductor device according to the third embodiment will be explained.

In the third embodiment, as shown in FIG. 25, in the first surface FS outside the first MOS transistor area FMTA, the first impurity region AIR1 electrically coupled to the first source electrode S1 abuts on the wall face of the first shallower trench portion FTR1 of the first gate trench TR1. In other words, the first impurity region AIR1 with the source potential abuts on the thin first thinner film portion FGI1. This brings about the same advantageous effects as the first embodiment.

Since the second impurity region AIR2 has the same structure as the first impurity region AIR1, the second impurity region AIR2 also brings about the same advantageous effects as the first impurity region AIR1.

The column regions SJ1 to SJ5 extend in the n⁻ epitaxial region ER in the vertical direction (direction from the first surface FS toward the second surface SS). Therefore, the column regions SJ1 to SJ5 and the n⁻ epitaxial region ER can make a super-junction structure, thereby decreasing the on-resistance and improving the breakdown voltage.

Fourth Embodiment

Figure 26:
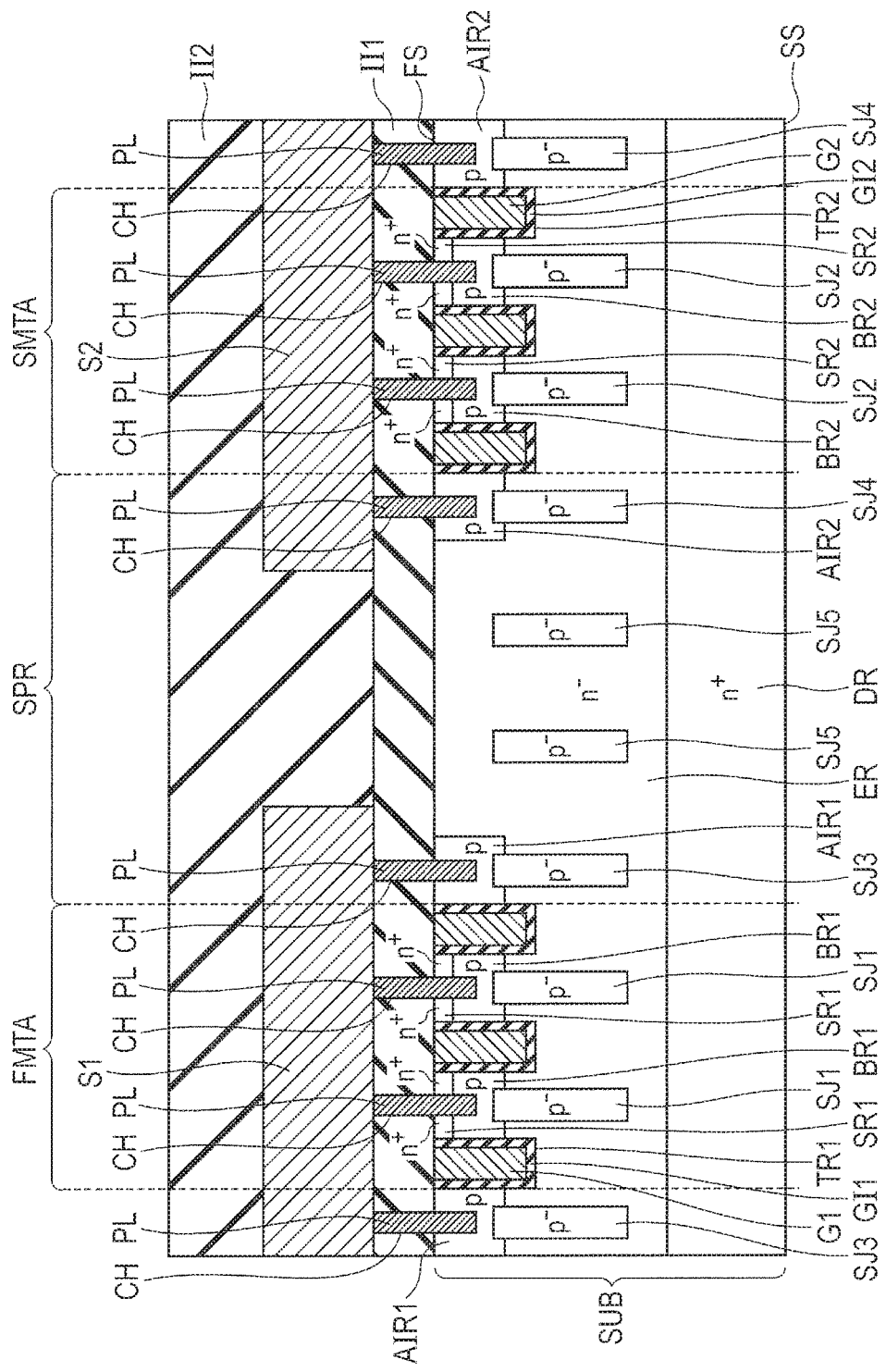
FIG. 26 is a sectional view which shows the structure of the semiconductor device according to the fourth embodiment.

As shown in FIG. 26, the semiconductor device according to the fourth embodiment is structurally different from the semiconductor device according to the third embodiment in that a plurality of (two or more) p⁻ column regions SJ5 are provided in the separation area SPR.

The elements other than the above in the fourth embodiment are virtually the same as in the third embodiment and the same elements as in the third embodiment are designated by the same reference signs and description thereof is not repeated here.

The fourth embodiment can improve the breakdown voltage more than the third embodiment.

Fifth Embodiment

Figure 27:
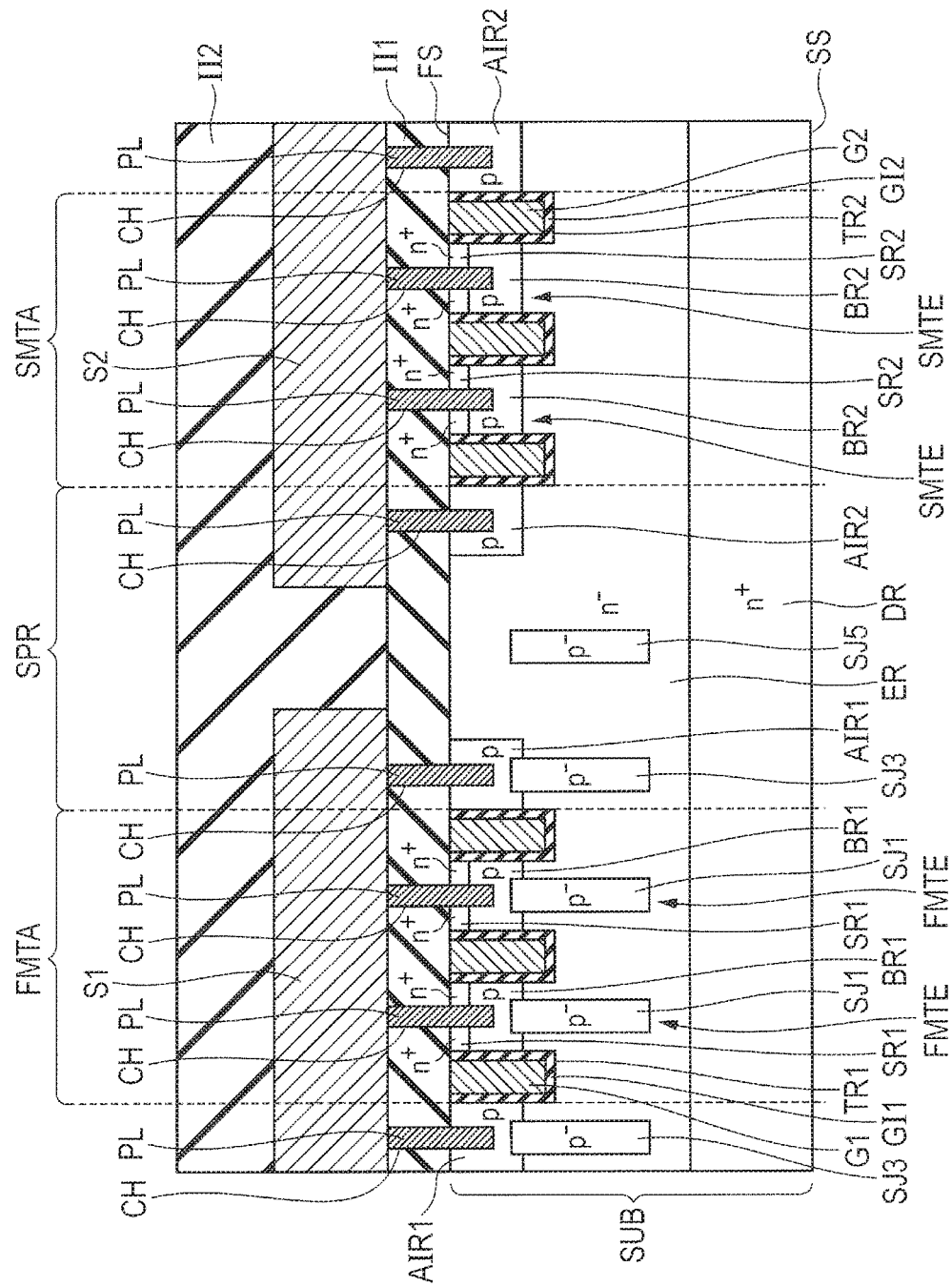
FIG. 27 is a sectional view taken along the line XXVII-XXVII in FIG. 28, which shows the structure of the semiconductor device according to the fifth embodiment.
Figure 28:
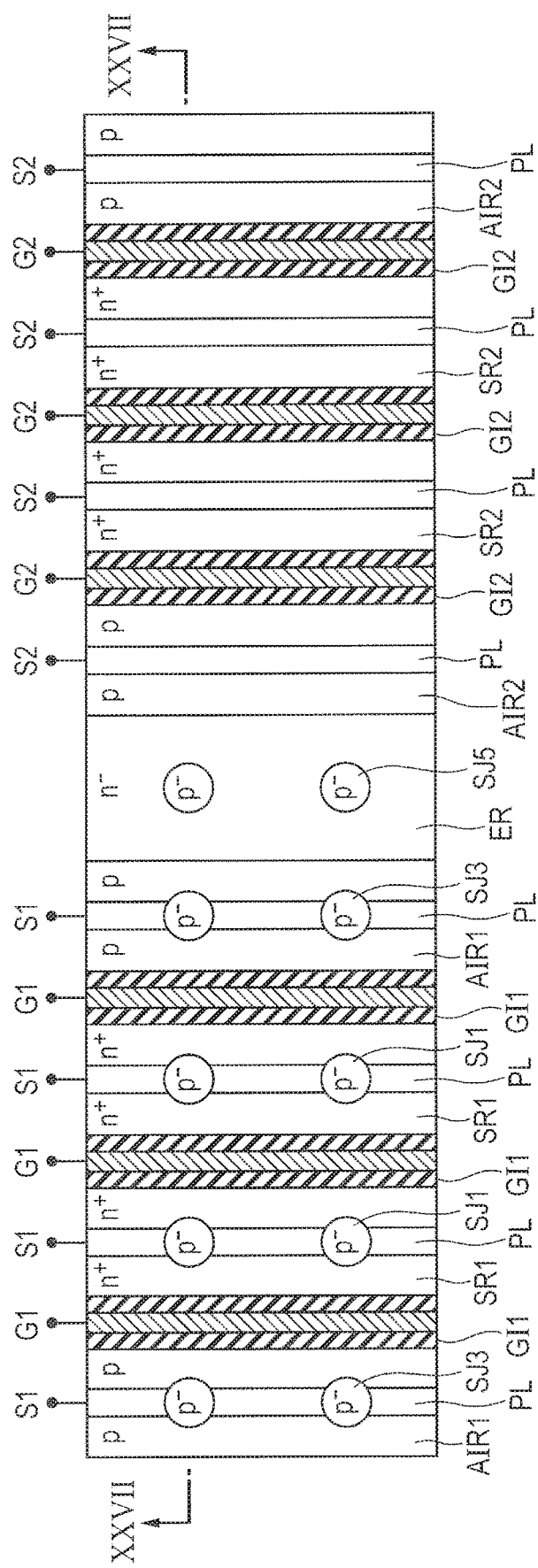
FIG. 28 is a plan view which shows the structure of the semiconductor device according to the fifth embodiment.

As shown in FIGS. 27 and 28, the semiconductor device according to the fifth embodiment is structurally different from the semiconductor device according to the third embodiment in that column regions SJ2 and SJ4 are not provided.

In the fifth embodiment, the entire lower surface of the second base region BR2 and the entire lower surface of the second impurity region AIR2 each make a PN junction with the epitaxial region ER.

The elements other than the above in the fifth embodiment are virtually the same as in the third embodiment and the same elements as in the third embodiment are designated by the same reference signs and description thereof is not repeated here.

Next, the method for manufacturing the semiconductor device according to the fifth embodiment will be described referring to FIGS. 27 to 35.

As shown in FIG. 27, an n⁻ epitaxial region ER is formed over a drain region DR by epitaxial growth. Consequently, a semiconductor substrate SUB is formed in which the drain region DR is located in the second surface SS and the n⁻ epitaxial region ER is located in the first surface FS. The drain region DR is a region to become the first drain region and the second drain region. The epitaxial region ER is a region to become the first epitaxial region and the second epitaxial region.

Figure 29:
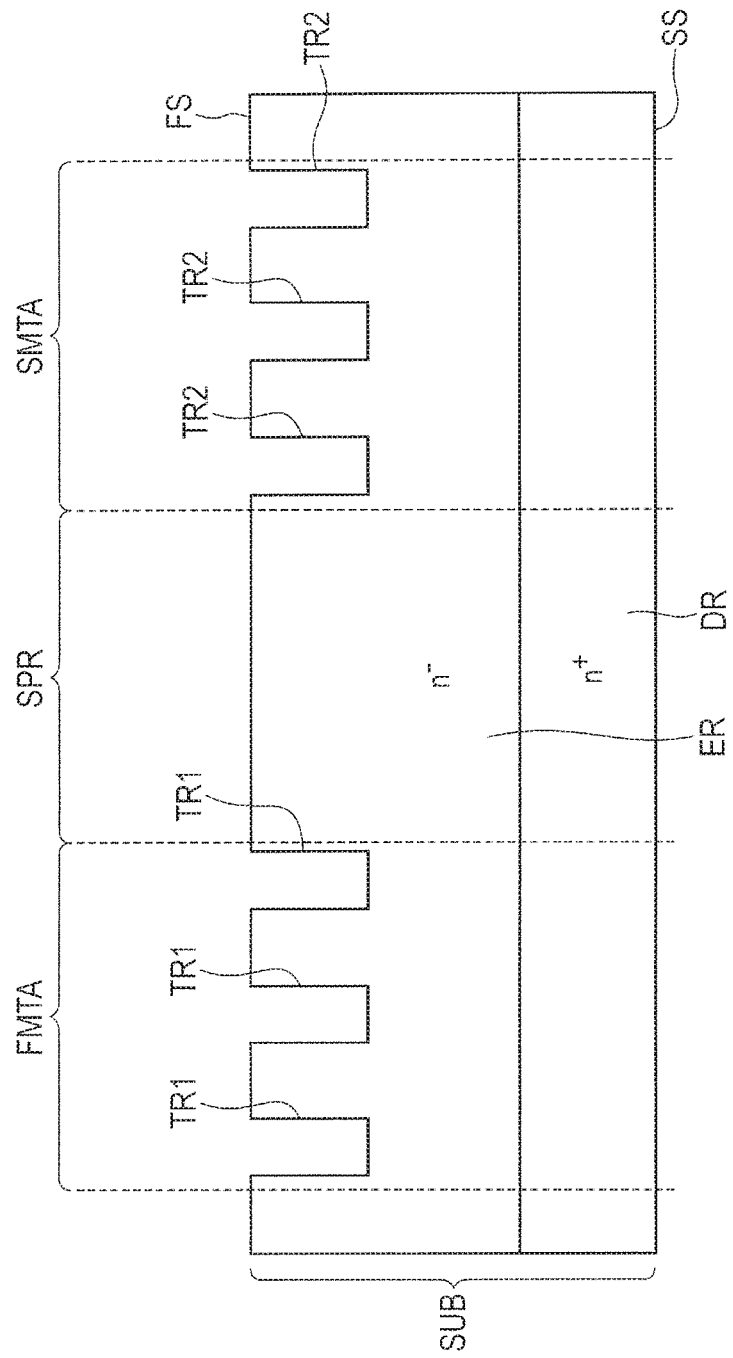
FIG. 29 is a sectional view which shows the first step of the method for manufacturing the semiconductor device according to the fifth embodiment.

After that, as shown in FIG. 29, by the ordinary photo-engraving technique and the etching technique, a first gate trench TR1 is made in the first surface FS in the first MOS transistor area FMTA and a second gate trench TR2 is made in the first surface FS in the second MOS transistor area SMTA.

Figure 30:
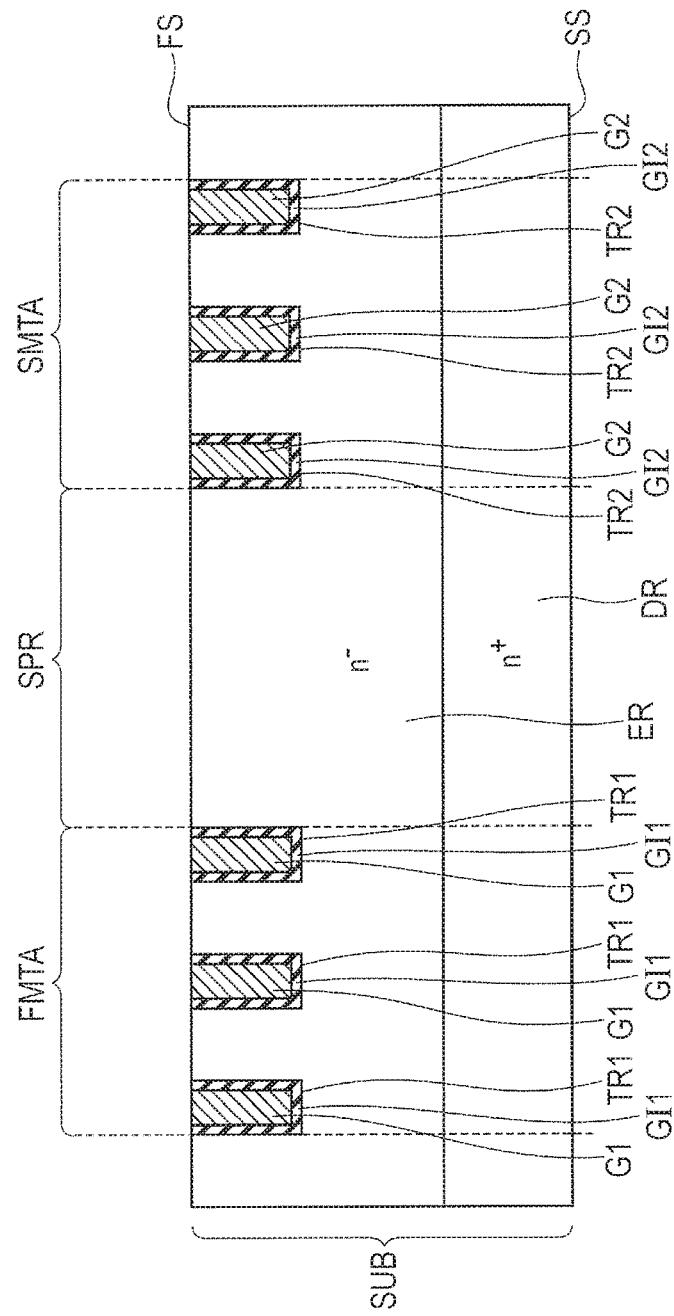
FIG. 30 is a sectional view which shows the second step of the method for manufacturing the semiconductor device according to the fifth embodiment.

As shown in FIG. 30, a first gate insulating layer GI1 and a first gate electrode G1 are formed in the first gate trench TR1. Similarly, a second gate insulating layer GI2 and a second gate electrode G2 are formed in the second gate trench TR2.

The first gate insulating layer GI1 and second gate insulating layer GI2 are formed at the same step. Also, the first gate electrode G1 and the second gate electrode G2 are formed at the same step.

Figure 31:
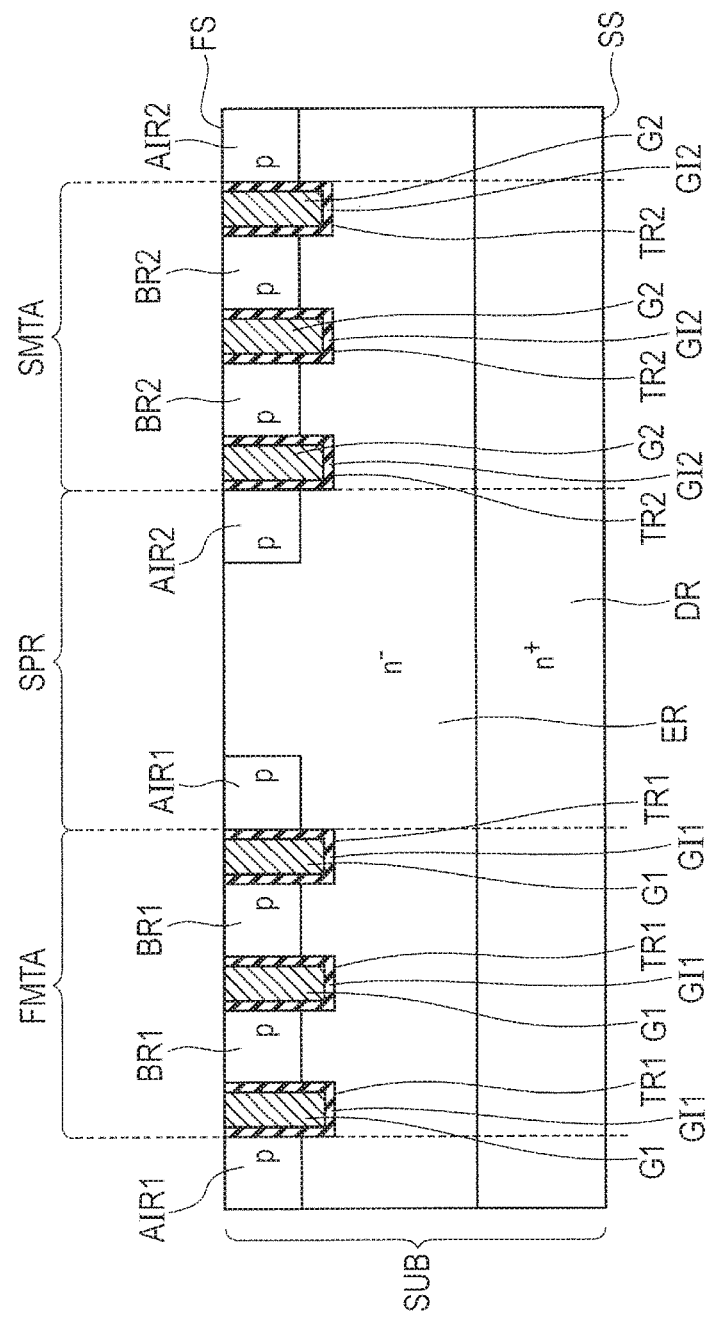
FIG. 31 is a sectional view which shows the third step of the method for manufacturing the semiconductor device according to the fifth embodiment.

As shown in FIG. 31, p-type impurities are implanted in the first surface FS of the semiconductor substrate SUB, for example, by the ion implantation technique. Consequently, a first base region BR1, second base region BR2, first impurity region AIR1, and second impurity region AIR2 are formed in the first surface FS of the semiconductor substrate SUB. The first base region BR1, second base region BR2, first impurity region AIR1, and second impurity region AIR2 are formed at the same ion implantation step.

The first base region BR1 is located in the first surface FS between first gate trenches TR1 in the first MOS transistor area FMTA. The first impurity region AIR1 is located in the first surface FS outside the first MOS transistor area FMTA in a manner to abut on the side wall of the first gate trench TR1.

The second base region BR2 is located in the first surface FS between second gate trenches TR2 in the second MOS transistor area SMTA. The second impurity region AIR2 is located in the first surface FS outside the second MOS transistor area SMTA in a manner to abut on the side wall of the second gate trench TR2.

Figure 32:
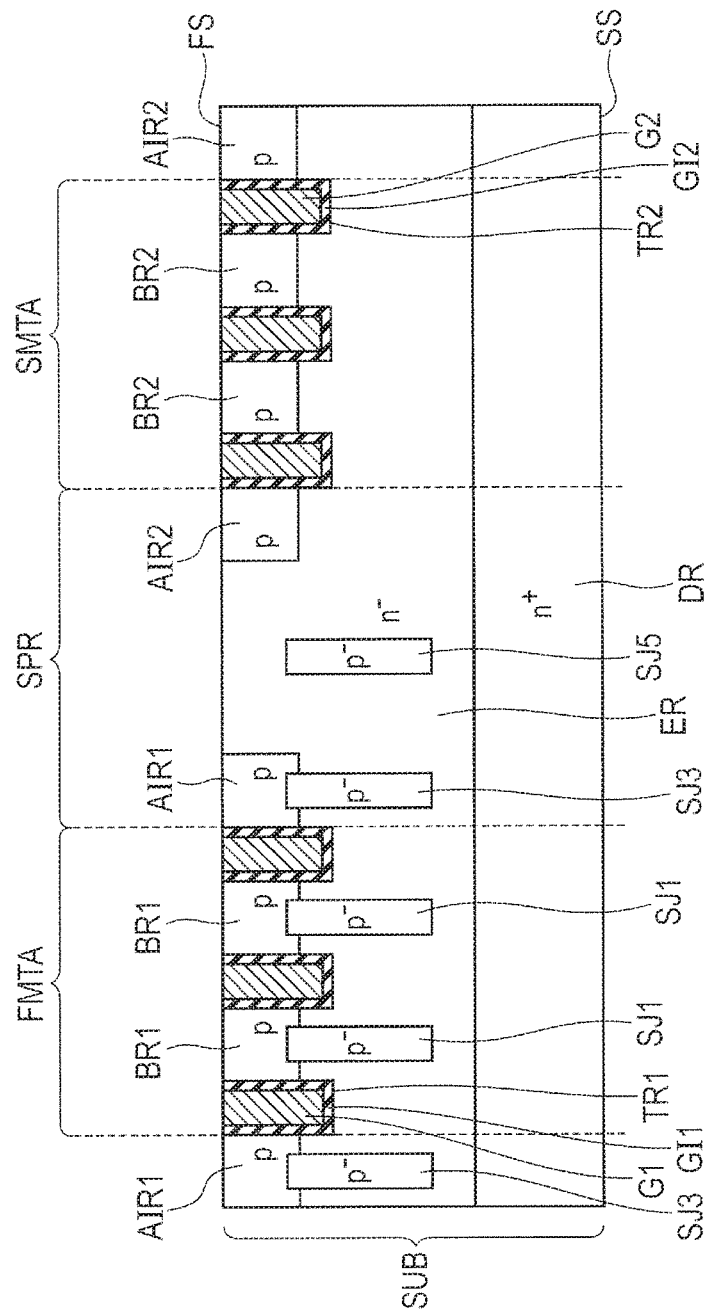
FIG. 32 is a sectional view which shows the fourth step of the method for manufacturing the semiconductor device according to the fifth embodiment.

As shown in FIG. 32, p-type impurities are implanted in the semiconductor substrate SUB, for example, by the ion implantation technique. Consequently, column regions SJ1, SJ3, and SJ5 are formed in the semiconductor substrate SUB. The column regions SJ1, SJ3, and SJ5 are formed at the same ion implantation step.

This ion implantation step is carried out while the second MOS transistor area SMTA and second impurity region AIR2 are entirely masked. Therefore, no column regions are formed under the second base region BR2 and second impurity region AIR2.

Figure 33:
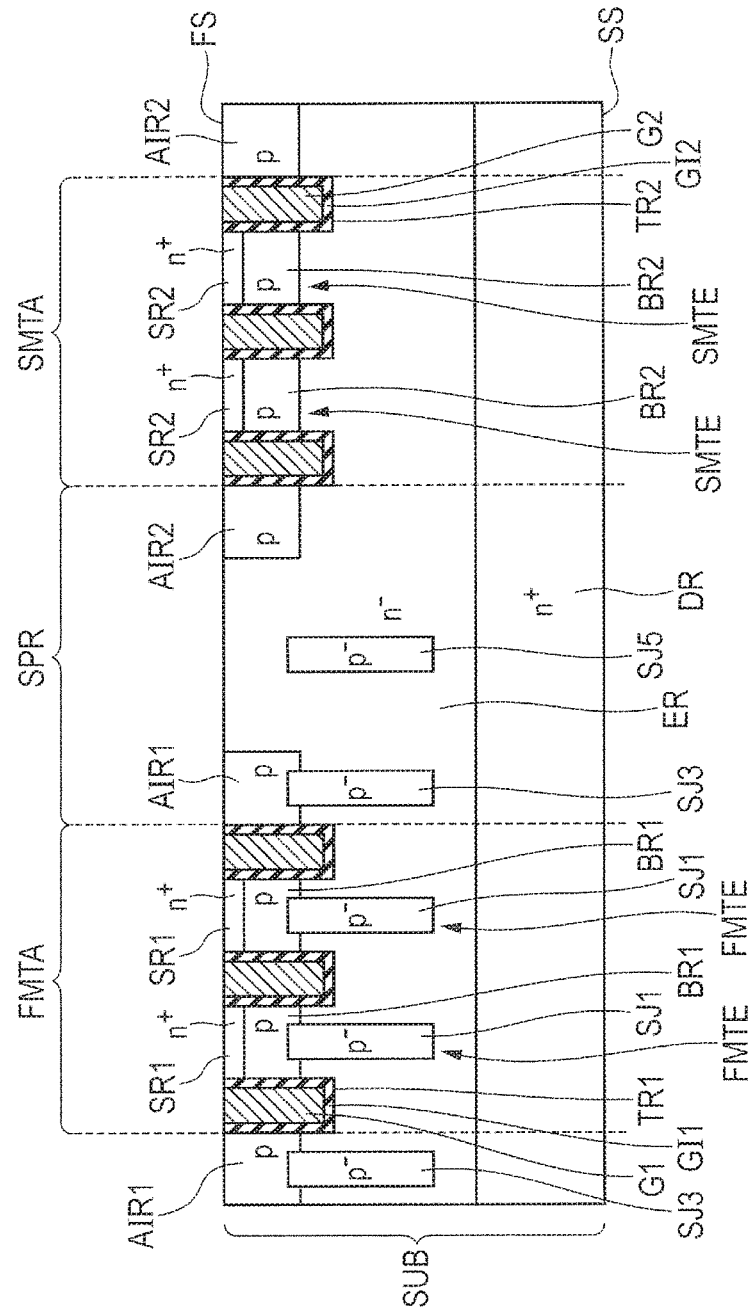
FIG. 33 is a sectional view which shows the fifth step of the method for manufacturing the semiconductor device according to the fifth embodiment.

As shown in FIG. 33, n-type impurities are implanted in the first surface FS of the semiconductor substrate SUB, for example, by the ion implantation technique. Consequently, a first source region SR1 and a second source region SR2 are formed in the first surface FS of the semiconductor substrate SUB.

The first source region SR1 is located in the first surface FS between first gate trenches TR1 in the first MOS transistor area FMTA to make a PN junction with the first base region BR1. The second source region SR2 is located in the first surface FS between second gate trenches TR2 in the second MOS transistor area SMTA to make a PN junction with the second base region BR2.

Figure 34:
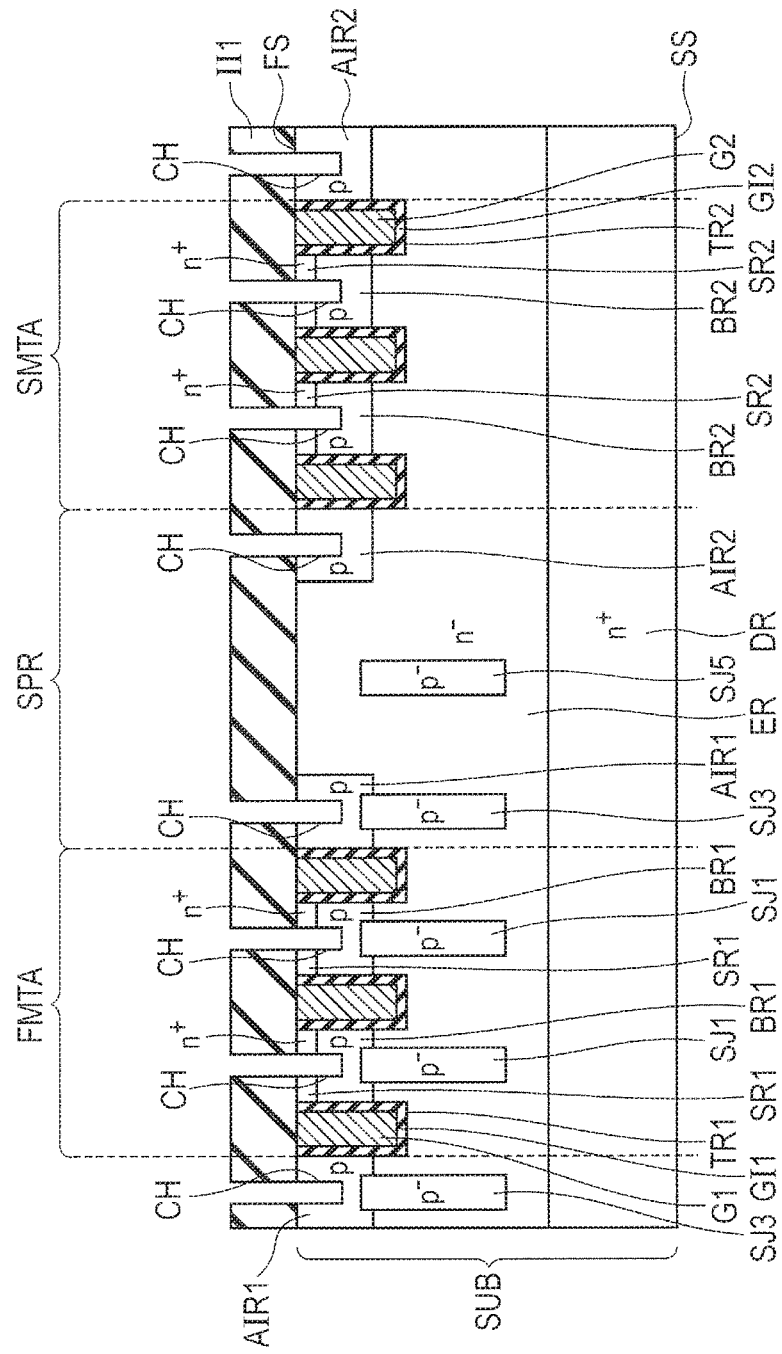
FIG. 34 is a sectional view which shows the sixth step of the method for manufacturing the semiconductor device according to the fifth embodiment.

As shown in FIG. 34, an interlayer insulating layer II1 is formed over the first surface FS of the semiconductor substrate SUB. After that, a plurality of contact holes CH are made in the interlayer insulating layer II1 by the ordinary photoengraving technique and etching technique.

The contact holes CH in the first MOS transistor area FMTA are formed so as to penetrate the first source region SR1 and reach the first base region BR1. The contact holes CH in the second MOS transistor area SMTA are formed so as to penetrate the second source region SR2 and reach the second base region BR2.

Furthermore, contact holes CH which reach the first impurity region AIR1 and contact holes CH which reach the second impurity region AIR2 are made.

Figure 35:
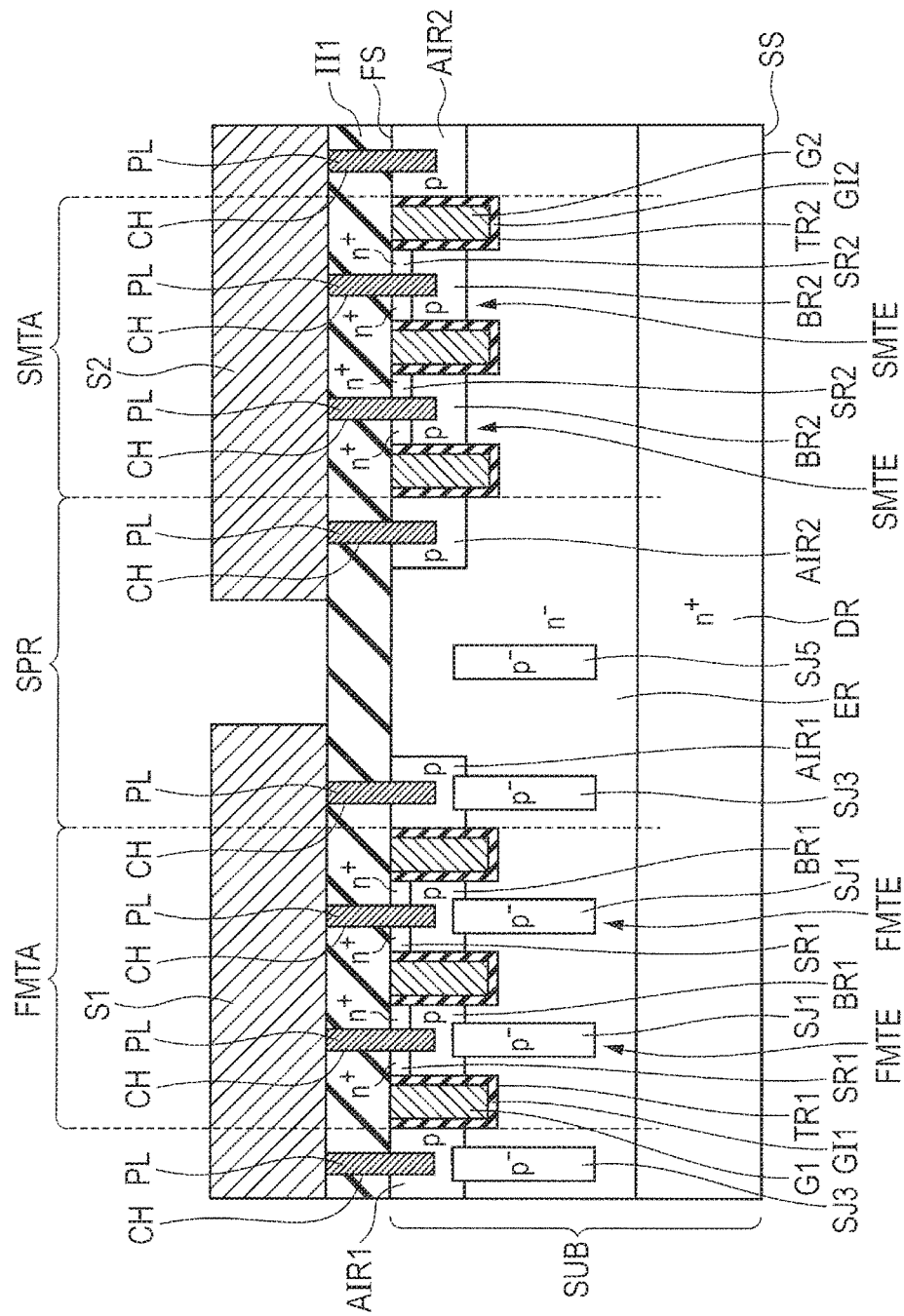
FIG. 35 is a sectional view which shows the seventh step of the method for manufacturing the semiconductor device according to the fifth embodiment.

As shown in FIG. 35, a plug conductive layer PL is formed in each of the contact holes CH. After that, a first source electrode S1 and a second source electrode S2 are formed over the upper surface of the interlayer insulating layer II1.

The first source electrode S1 is electrically coupled to the first source region SR1, first base region BR1, and first impurity region AIR1. The second source electrode S2 is electrically coupled to the second source region SR2, second base region BR2, and second impurity region AIR2.

After that, as shown in FIG. 27, an interlayer insulating layer 112 is formed over the interlayer insulating layer II1 in a manner to cover the first source electrode S1 and second source electrode S2. The semiconductor device according to the fifth embodiment is thus manufactured.

In the fifth embodiment, since column regions SJ2 and SJ4 are not provided, the breakdown voltage in the second MOS transistor area SMTA is lower than in the third embodiment, but the on-resistance is lower than in the third embodiment. The semiconductor device SED according to each of the above embodiments is not limited to a semiconductor chip; instead it may be in the form of a wafer or a resin-sealed package.

Furthermore, the first MOS transistor FMTA and second MOS transistor SMTR may be replaced by MIS (Metal Insulator Semiconductor) transistors.

The embodiments have been so far described on the assumption that the first MOS transistor FMTR and second MOS transistor SMTR are of the n-channel type, but instead they may be of the p-channel type. If they are of the p-channel type, the first impurity region AIR1 and second impurity region AIR2 have n-type conductivity.

The invention made by the present inventors has been so far explained concretely in reference to the preferred embodiments thereof. However, the invention is not limited thereto and it is obvious that these details may be modified in various ways without departing from the gist thereof.

What is claimed is:

1. A semiconductor device having a bidirectional switch, the semiconductor device comprising:
    a semiconductor substrate having a first surface and a second surface opposite to each other and having a first gate trench extending from the first surface toward the second surface;
    a first transistor element which includes a first drain region of a first conductivity type located in the second surface, a first source region of the first conductivity type located in the first surface, and a first gate electrode located inside the first gate trench and is included in the bidirectional switch;
    a first impurity region of a second conductivity type which abuts on a side wall of the first gate trench outside an area for the first transistor element and is electrically coupled to the first source region; and
    a first base region of the second conductivity type making a PN junction with the first source region and facing the first gate electrode while being insulated therefrom,
    wherein the first impurity region has a larger depth from the first surface than the first base region and has a lower impurity concentration than the first base region.

2. The semiconductor device according to claim 1,
    wherein the semiconductor substrate has a second gate trench extending from the first surface toward the second surface,
    wherein the semiconductor device further comprises:
        a second transistor element which includes a second drain region of the first conductivity type located in the second surface, a second source region of the first conductivity type located in the first surface, and a second gate electrode located inside the second gate trench and is included in the bidirectional switch; and
        a second impurity region of the second conductivity type which abuts on a side wall of the second gate trench outside an area for the second transistor element and is electrically coupled to the second source region.

3. The semiconductor device according to claim 2, wherein the first impurity region and the second impurity region are separated from each other.

4. The semiconductor device according to claim 1, further comprising:
    a source electrode located over the first surface;
    a first conductive layer coupled to the source electrode and the first source region; and
    a second conductive layer coupled to the source electrode and the first impurity region,
    wherein the first conductive layer extends into the semiconductor substrate from the first surface deeper than the second conductive layer.

5. The semiconductor device according to claim 1, further comprising:
    a gate insulating layer located between a wall face of the first gate trench and the first gate electrode,
    wherein the gate insulating layer has a first thickness in a first region from the first surface to a first depth and has a second thickness larger than the first thickness in a second region from the first depth to a second depth nearer to the second surface, and
    wherein the first impurity region extends from the first surface to a depth position nearer to the second surface than the first depth.

6. The semiconductor device according to claim 2, further comprising:
- a second base region of the second conductivity type making a PN junction with the second source region and facing the second gate electrode while being insulated therefrom;
- a first column region of the second conductivity type being coupled to the first base region and extending from the first base region toward the second surface; and
- a second column region of the second conductivity type being coupled to the second base region and extending from the second base region toward the second surface.

7. The semiconductor device according to claim 2, further comprising:
- a second base region of the second conductivity type making a PN junction with the second source region and facing the second gate electrode while being insulated therefrom;
- an epitaxial region of the first conductivity type making a PN junction with each of the first base region and the second base region; and
- a column region of the second conductivity type which is located in the epitaxial region between the area for the first transistor element and the area for the second transistor element and has a floating potential.

8. The semiconductor device according to claim 2, wherein the second impurity region has a larger depth from the first surface than the second base region and has a lower impurity concentration than the second base region.

* * * * *